（12）United States Patent
Yazdandoost et al.

(10) Patent No.: US 12,324,325 B2
(45) Date of Patent: Jun. 3, 2025

(54) AMBIENT LIGHT SENSING DISPLAY ASSEMBLIES

(71) Applicant: Apple Inc., Cupertino, CA (US)

(72) Inventors: Mohammad Yeke Yazdandoost, San Jose, CA (US); Giovanni Gozzini, Berkeley, CA (US); Volodymyr Borshch, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1158 days.

(21) Appl. No.: 17/096,249

(22) Filed: Nov. 12, 2020

(65) Prior Publication Data

US 2021/0083030 A1    Mar. 18, 2021

Related U.S. Application Data

(63) Continuation of application No. 16/220,722, filed on Dec. 14, 2018, now Pat. No. 10,840,320.

(60) Provisional application No. 62/738,494, filed on Sep. 28, 2018.

(51) Int. Cl.
| | |
|---|---|
| *H10K 59/13* | (2023.01) |
| *G01J 1/42* | (2006.01) |
| *H10K 59/60* | (2023.01) |
| *G02F 1/133* | (2006.01) |

(52) U.S. Cl.
CPC ............ *H10K 59/13* (2023.02); *G01J 1/4204* (2013.01); *H10K 59/60* (2023.02); *G02F 1/13318* (2013.01); *G09G 2360/144* (2013.01)

(58) Field of Classification Search
CPC ....... H10K 59/13; H10K 59/60; G01J 1/4204; G02F 1/13318; G09G 2360/144
See application file for complete search history.

(56) References Cited

U.S. PATENT DOCUMENTS

| 8,704,803 | B2* | 4/2014 | Koyama | G09G 3/30 345/204 |
|---|---|---|---|---|
| 2003/0122749 | A1 | 7/2003 | Booth et al. | |
| 2003/0151569 | A1* | 8/2003 | Lee | G09G 3/3233 345/84 |
| 2007/0258123 | A1* | 11/2007 | Xu | B81C 1/00246 359/245 |
| 2008/0165116 | A1* | 7/2008 | Herz | G09G 3/3406 345/98 |
| 2008/0297487 | A1 | 12/2008 | Hotelling et al. | |
| 2013/0278868 | A1* | 10/2013 | Dunn | G09F 9/35 362/97.1 |

(Continued)

OTHER PUBLICATIONS

Jafarabadiashtiani, "Pixel Circuits and Driving Schemes for Active-Matrix Organic Light-Emitting Diode Displays." A thesis presented to the University of Waterloo in fulfilment of the thesis requirement for the degree of Doctor in Philosophy in Electrical and Computer Engineering, 2007, 188 pages.

(Continued)

*Primary Examiner* — Georgia Y Epps
*Assistant Examiner* — Don J Williams
(74) *Attorney, Agent, or Firm* — Kubota & Basol LLP

(57) ABSTRACT

Systems, methods, and computer-readable media for sensing ambient light with a display assembly are provided. A display assembly may include at least one light-generating component and at least one light-detecting component, each of which may be positioned underneath a single opening in an electronic device housing.

19 Claims, 14 Drawing Sheets

(56) References Cited

U.S. PATENT DOCUMENTS

| | | |
|---|---|---|
| 2016/0360167 A1 | 12/2016 | Mitchell et al. |
| 2017/0200411 A1 | 7/2017 | Song et al. |
| 2018/0212060 A1* | 7/2018 | Kang .................. G02F 1/13318 |
| 2019/0377210 A1 | 12/2019 | Chikama et al. |
| 2020/0105851 A1 | 4/2020 | Yazdandoost et al. |

OTHER PUBLICATIONS

Corrected Notice of Allowability received for U.S. Appl. No. 16/220,722, mailed on Sep. 18, 2020, 3 pages.
Non Final Office Action received for U.S. Appl. No. 16/220,722, mailed on Mar. 23, 2020, 14 pages.
Notice of Allowance received for U.S. Appl. No. 16/220,722, mailed on Jul. 15, 2020, 8 pages.
Restriction Requirement received for U.S. Appl. No. 16/220,722, mailed on Jan. 29, 2020, 7 pages.

\* cited by examiner

AMBIENT LIGHT SENSING DISPLAY ASSEMBLIES

CROSS-REFERENCE TO RELATED APPLICATION(S)

This application is a continuation of U.S. patent application Ser. No. 16/220,722, filed Dec. 14, 2018 (now U.S. Pat. No. 10,840,320), which claims the benefit of prior filed U.S. Provisional Patent Application No. 62/738,494, filed Sep. 28, 2018, each of which is hereby incorporated by reference herein in its entirety.

TECHNICAL FIELD

This disclosure relates to ambient sensing display assemblies.

Background of the Disclosure

An electronic device (e.g., a laptop computer, a cellular telephone, etc.) may be provided with a display assembly that consumes a majority of an external device surface. However, heretofore, such display assemblies have prevented adequate ambient light sensing with such display assemblies.

Summary of the Disclosure

This document describes systems, methods, and computer-readable media for sensing ambient light with a display assembly.

For example, an electronic device is provided that may include a display assembly including an external display surface, a light-emitting diode operative to emit light for illuminating the external display surface, and a light-sensing diode operative to detect light passing through the external display surface, wherein an organic element of the light-emitting diode and an organic element of the light-sensing diode lie in a single layer extending along and underneath the external display surface.

As another example, an electronic device is provided that may include a housing, a processor within the housing, and a display assembly that may include an external display surface exposed through an opening in the housing, a light-emitting component controllable by the processor to emit light for illuminating the external display surface, and a light-sensing component controllable by the processor to detect light passing through the external display surface.

As yet another example, a method for providing ambient light sensing over a surface area is provide that may include emitting visible light from a first plurality of locations arranged underneath the surface area and detecting ambient light at a second plurality of locations arranged underneath the surface area.

As yet another example, a method for operating a display assembly of an electronic device that includes an external surface of an external component and a processor component, where the display assembly includes a plurality of light-generating components and a plurality of light-detecting components, is provided that may include operating, with the processor component, at least a subset of the plurality of light-generating components to create a visible image via the external surface, concurrently with the operating the at least the subset of the plurality of light-generating components, operating, with the processor component, at least a subset of the plurality of light-detecting components to receive ambient light via the external surface, and receiving, with the processing component, one or more results signals based on the received ambient light.

As yet another example, a method for manufacturing a light-sensing display assembly is provided that may include forming a semiconductor processing layer and combining a plurality of display element cells and at least one light-sensing cell in the semiconductor processing layer, wherein the display element cells are configured to emit or control visible light for displaying images at a display and the at least one light-sensing cell is configured to detect visible light passed through the display.

As yet another example, an electronic device is provided that may include a housing, a processor within the housing, and a display assembly including an external display surface exposed through an opening in the housing, and a pixel including an element controllable by the processor to alternate between illuminating the external display surface and detecting light passing through the external display surface.

This Summary is provided only to summarize some example embodiments, so as to provide a basic understanding of some aspects of the subject matter described in this document. Accordingly, it will be appreciated that the features described in this Summary are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The discussion below makes reference to the following drawings, in which like reference characters may refer to like parts throughout, and in which.

DETAILED DESCRIPTION OF THE DISCLOSURE

Systems, methods, and computer-readable media may be provided for sensing ambient light with a display assembly. The display assembly may include at least one light-generating component and at least one light-detecting component, each of which may be positioned underneath a single opening in an electronic device housing. An external surface of an external component (e.g., cover glass) may be exposed through such a housing opening, while at least one light-generating component of the display assembly may be configured to selectively emit light onto the external component and at least one light-detecting component of the display assembly may be configured to selectively detect ambient light passing through the external component. At least one light-detecting component and at least one light-generating component of such a display assembly may be provided in a single layer underneath the external component. For example, organic materials of an organic light emitting diode of a light-generating component and organic materials of an organic photodiode of a light-detecting component may be provided adjacent one another in a single layer. In some embodiments, the display assembly may include a selection subassembly that may be operative to selectively enable or otherwise control functionality of one, some, or each light-generating component of the display assembly and/or one, some, or each light-detecting component of the display assembly. For example, the selection subassembly may be provided by a thin film transistor (TFT) layer, and at least a portion of at least one light-detecting component of the display assembly may be provided in that layer (e.g., by an amorphous silicon detector in a TFT control layer that may be provided above or below a layer in which at least one light-generating component of the display assembly may be provided). This may obviate the need for an ambient light sensor assembly that is distinct from a display assembly in an electronic device.

Figure 1:
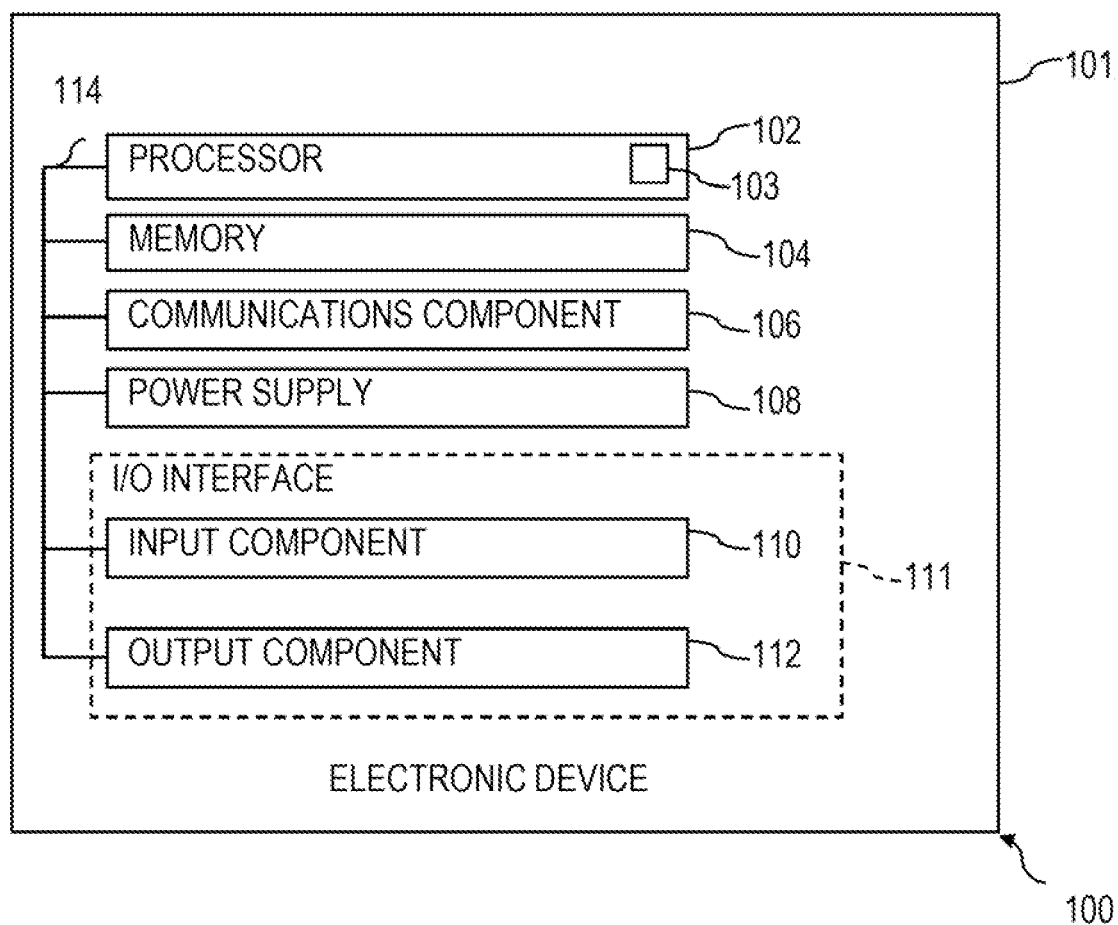
FIG. 1 is a schematic view of an illustrative an electronic device with a light sensing display assembly.
Figure 1A:
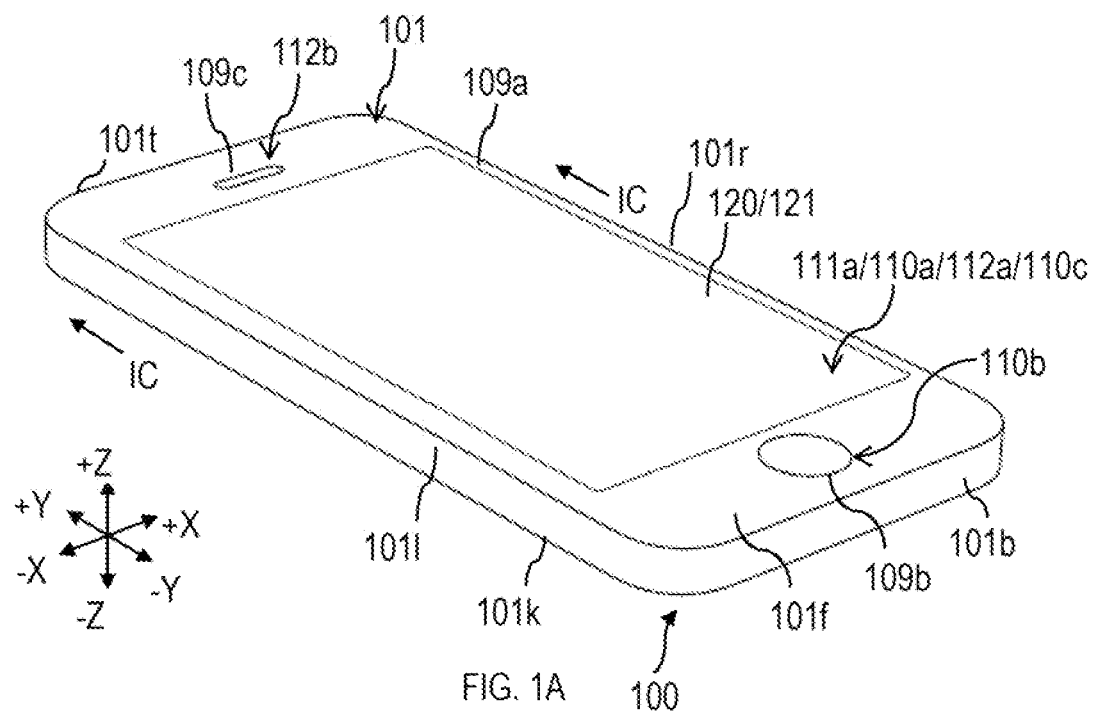
FIG. 1A is a front, left, bottom perspective view of the electronic device of FIG. 1, in accordance with some embodiments.
Figure 1B:
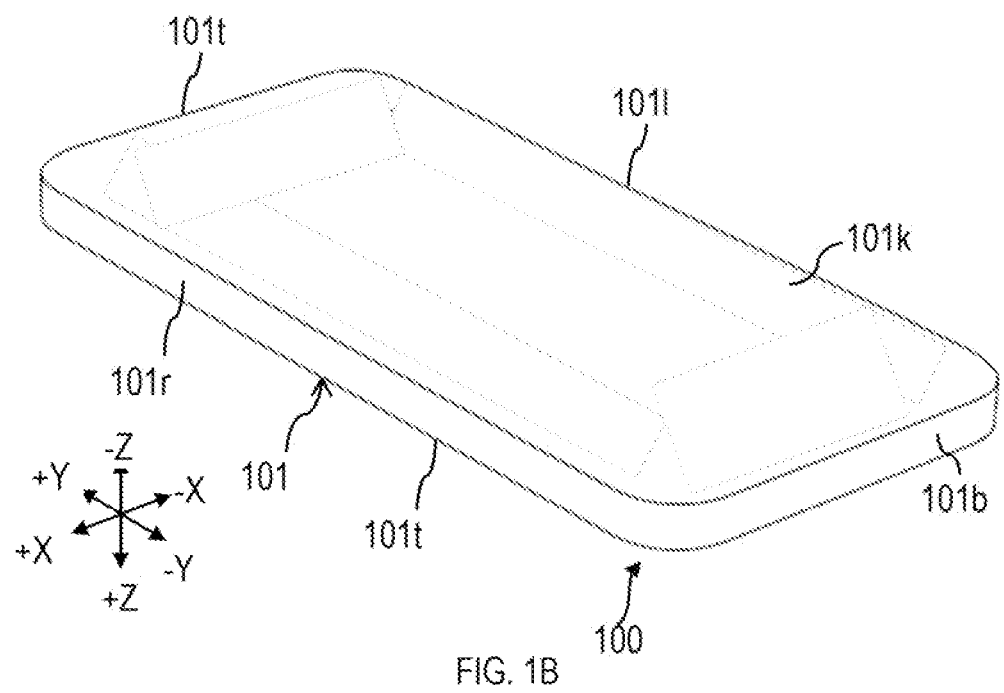
FIG. 1B is a back, right, bottom perspective view of the electronic device of FIGS. 1 and 1A, in accordance with some embodiments.

FIG. 1 is a schematic view of an illustrative electronic device 100 that may include an ambient light sensing display assembly. Electronic device 100 can include, but is not limited to, a music player (e.g., an iPod™ available by Apple Inc. of Cupertino, California), video player, still image player, game player, other media player, music recorder, movie or video camera or recorder, still camera, other media recorder, radio, medical equipment, domestic appliance, transportation vehicle instrument, musical instrument, calculator, cellular telephone (e.g., an iPhone™ available by Apple Inc.), other wireless communication device, personal digital assistant, remote control, pager, computer (e.g., a desktop (e.g., an iMac™ available by Apple Inc.), laptop (e.g., a MacBook™ available by Apple Inc.), tablet (e.g., an iPod™ available by Apple Inc.), server, etc.), monitor, television, stereo equipment, set up box, set-top box, boom box, modem, router, printer, or any combination thereof. Electronic device 100 may be any portable, mobile, hand-held, or miniature electronic device that may be configured to sense ambient light with its display assembly wherever a user travels. Some miniature electronic devices may have a form factor that is smaller than that of hand-held electronic devices, such as an iPod™. Illustrative miniature electronic devices can be integrated into various objects that may include, but are not limited to, watches (e.g., an Apple Watch™ available by Apple Inc.), rings, necklaces, belts, accessories for belts, headsets, accessories for shoes, virtual reality devices, glasses, other wearable electronics, accessories for sporting equipment, accessories for fitness equipment, key chains, or any combination thereof. Alternatively, electronic device 100 may not be portable at all, but may instead be generally stationary.

As shown in FIG. 1, for example, electronic device 100 may include a processor 102, memory 104, a communications component 106, a power supply 108, an input component 110, and an output component 112. Electronic device 100 may also include a bus 114 that may provide one or more wired or wireless communication links or paths for transferring data and/or power to, from, or between various other components of device 100. In some embodiments, one or more components of electronic device 100 may be combined or omitted. Moreover, electronic device 100 may include any other suitable components not combined or included in FIG. 1 and/or several instances of the components shown in FIG. 1. For the sake of simplicity, only one of each of the components is shown in FIG. 1.

Memory 104 may include one or more storage mediums, including for example, a hard-drive, flash memory, permanent memory such as read-only memory ("ROM"), semi-permanent memory such as random access memory ("RAM"), any other suitable type of storage component, or any combination thereof. Memory 104 may include cache memory, which may be one or more different types of memory used for temporarily storing data for electronic device applications. Memory 104 may be fixedly embedded within electronic device 100 or may be incorporated onto one or more suitable types of components that may be repeatedly inserted into and removed from electronic device 100 (e.g., a subscriber identity module ("SIM") card or secure digital ("SD") memory card). Memory 104 may store media data (e.g., music and image files), software (e.g., for implementing functions on device 100), firmware, preference information (e.g., media playback preferences), lifestyle information (e.g., food preferences), exercise information (e.g., information obtained by exercise monitoring equipment), transaction information (e.g., credit card information), wireless connection information (e.g., information that may enable device 100 to establish a wireless connection), subscription information (e.g., information that keeps track of podcasts or television shows or other media a user subscribes to), contact information (e.g., telephone numbers and e-mail addresses), calendar information, pass information (e.g., transportation boarding passes, event tickets, coupons, store cards, financial payment cards, etc.), any other suitable data, or any combination thereof.

Communications component 106 may be provided to allow device 100 to communicate with one or more other electronic devices or servers or other remote entities using any suitable communications protocol. For example, communications component 106 may support WiFi™ (e.g., an 802.11 protocol), ZigBee™ (e.g., an 802.15.4 protocol), WiDi™, Ethernet, Bluetooth™, Bluetooth™ Low Energy ("BLE"), high frequency systems (e.g., 900 MHz, 2.4 GHz, and 5.6 GHz communication systems), infrared, transmission control protocol/internet protocol ("TCP/IP") (e.g., any of the protocols used in each of the TCP/IP layers), Stream Control Transmission Protocol ("SCTP"), Dynamic Host Configuration Protocol ("DHCP"), hypertext transfer protocol ("HTTP"), BitTorrent™, file transfer protocol ("FTP"), real-time transport protocol ("RTP"), real-time streaming protocol ("RTSP"), real-time control protocol ("RTCP"), Remote Audio Output Protocol ("RAOP"), Real Data Transport Protocol™ ("RDTP"), User Datagram Protocol ("UDP"), secure shell protocol ("SSH"), wireless distribution system ("WDS") bridging, any communications protocol that may be used by wireless and cellular telephones and personal e-mail devices (e.g., Global System for Mobile Communications ("GSM"), GSM plus Enhanced Data rates for GSM Evolution ("EDGE"), Code Division Multiple Access ("CDMA"), Orthogonal Frequency-Division Multiple Access ("OFDMA"), high speed packet access ("HSPA"), multi-band, etc.), any communications protocol that may be used by a low power Wireless Personal Area Network ("6LoWPAN") module, any suitable cellular communications protocol (e.g., broadband cellular network technologies (e.g., 3G, 4G, 5G, etc.)), any other communications protocol, or any combination thereof. Communications component 106 may also include or may be electrically coupled to any suitable transceiver circuitry that can enable device 100 to be communicatively coupled to another device (e.g., a server, host computer, scanner, accessory device, etc.) with that other device wirelessly, or via a wired connection (e.g., using a connector port). Communications component 106 may be configured to determine a geographical position of electronic device 100 and/or any suitable data that may be associated with that position. For example, communications component 106 may utilize a global positioning system ("GPS") or a regional or site-wide positioning system that may use cell tower positioning technology or Wi-Fi™ technology, or any suitable location-based service or real-time locating system, which may leverage a geo-fence for providing any suitable location-based data to device 100.

Power supply 108 can include any suitable circuitry for receiving and/or generating power, and for providing such power to one or more of the other components of electronic device 100. For example, power supply 108 can be coupled to a power grid (e.g., when device 100 is not acting as a portable device or when a battery of the device is being charged at an electrical outlet with power generated by an electrical power plant). As another example, power supply 108 can be configured to generate power from a natural source (e.g., solar power using solar cells). As another example, power supply 108 can include one or more batteries for providing power (e.g., when device 100 is acting as a portable device).

One or more input components 110 may be provided to permit a user or device environment to interact or interface with device 100. For example, input component 110 can take a variety of forms, including, but not limited to, a touch pad, dial, click wheel, scroll wheel, touch screen, one or more buttons (e.g., a keyboard), mouse, joy stick, track ball, microphone, camera, scanner (e.g., a barcode scanner or any other suitable scanner that may obtain product identifying information from a code, such as a linear barcode, a matrix barcode (e.g., a quick response ("QR") code), or the like), proximity sensor, light detector (e.g., ambient light sensor), biometric sensor (e.g., a fingerprint reader or other feature recognition sensor, which may operate in conjunction with a feature-processing application that may be accessible to electronic device 100 for authenticating a user), line-in connector for data and/or power, and combinations thereof. An input component may be any suitable sensor assembly that may take one of various forms, including, but not limited to, any suitable temperature sensor (e.g., thermistor, thermocouple, thermometer, silicon bandgap temperature sensor, bimetal sensor, etc.) for detecting the temperature of a portion of electronic device 100, a performance analyzer for detecting an application characteristic related to the current operation of one or more components of electronic device 100 (e.g., processor 102), one or more single-axis or multi-axis accelerometers, angular rate or inertial sensors (e.g., optical gyroscopes, vibrating gyroscopes, gas rate gyroscopes, or ring gyroscopes), magnetometers (e.g., scalar or vector magnetometers), pressure sensors, light sensors (e.g., ambient light sensors ("ALS"), infrared ("IR") light sensors, ultraviolet ("UV") light sensors, etc.), linear velocity sensors, thermal sensors, microphones, proximity sensors, capacitive proximity sensors, acoustic sensors, sonic or sonar sensors, radar sensors, image sensors, video sensors, global positioning system ("GPS") detectors, radio frequency ("RF") detectors, RF or acoustic Doppler detectors, RF triangulation detectors, electrical charge sensors, peripheral device detectors, event counters, and any combinations thereof. Each input component 110 can be configured to provide one or more dedicated control functions for making selections or issuing commands associated with operating device 100.

Electronic device 100 may also include one or more output components 112 that may present information (e.g., graphical, audible, and/or tactile information) to a user of device 100. For example, output component 112 of electronic device 100 may take various forms, including, but not limited to, audio speakers, headphones, line-out connectors for data and/or power, visual displays (e.g., for transmitting data via visible light and/or via invisible light), infrared ports, flashes (e.g., light sources for providing artificial light for illuminating an environment of the device), tactile/haptic outputs (e.g., rumblers, vibrators, etc.), and combinations thereof. As a specific example, electronic device 100 may include a display assembly output component as output component 112, where such a display assembly output component may include any suitable type of display or interface for presenting visual data to a user with visible light. A display assembly output component may include a display embedded in device 100 or coupled to device 100 (e.g., a removable display). A display assembly output component may include, for example, a liquid crystal display ("LCD"), which may include any suitable backlight or other light source that may or may not use one or any other suitable number of light emitting diodes ("LEDs"), a light emitting diode ("LED") display, a plasma display, an organic light-emitting diode ("OLED") display, a micro-LED display, a nano-LED display, a surface-conduction electron-emitter display ("SED"), a carbon nanotube display, a nanocrystal display, any other suitable type of display, or combination thereof. Alternatively, a display assembly output component can include a movable display or a projecting system for providing a display of content on a surface remote from electronic device 100, such as, for example, a video projector, a head-up display, or a three-dimensional (e.g., holographic) display. As another example, a display assembly output component may include a digital or mechanical viewfinder, such as a viewfinder of the type found in compact digital cameras, reflex cameras, or any other suitable still or video camera. A display assembly output component may include display driver circuitry, circuitry for driving display drivers, or both, and such a display assembly output component can be operative to display content (e.g., media playback information, application screens for applications implemented on electronic device 100, information regarding ongoing communications operations, information regarding incoming communications requests, device operation screens, etc.) that may be under the direction of processor 102. In some embodiments, a display assembly output component may include a single or only a few light sources (e.g., one or a few LEDs) that may provide sufficient light for enabling a multi-pixel display and/or that may provide a single display object ((e.g., an illuminated logo or status light (e.g., when a single light source shines through a light-transmissive portion of housing 101 of device 100))).

It should be noted that one or more input components and one or more output components may sometimes be referred to collectively herein as an input/output ("I/O") component or I/O interface (e.g., input component 110 and output component 112 as I/O component or I/O interface). For example, input component 110 and output component 112 may sometimes be a single I/O interface 111, such as a touch screen that may receive input information through a user's touch of a display screen and that may also provide visual information to a user via that same display screen, and/or such as an ambient light sensing display assembly that may detect ambient light (e.g., from the environment of device 100) and that may also emit light (e.g., graphical information to a user) via that same display assembly.

Processor 102 of electronic device 100 may include any suitable processing circuitry that may be operative to control the operations and performance of one or more components of electronic device 100. For example, processor 102 may receive input signals from one or more input components 110 and/or drive output signals through one or more output components 112. As shown in FIG. 1, processor 102 may be used to run one or more applications, such as an application 103. Application 103 may include, but is not limited to, one or more operating system applications, firmware applications, media playback applications, media editing applications, pass applications, calendar applications, state determination applications, biometric feature-processing applications, compass applications, health applications, thermometer applications, weather applications, thermal management applications, video game applications, or any other suitable applications. For example, processor 102 may load application 103 as a user interface program to determine how instructions or data received via an input component 110 and/or any other component of device 100 (e.g., communications component 106 and/or power supply 108) may manipulate the one or more ways in which information may be stored at memory 104 and/or provided to a user or the ambient environment via an output component 112 and/or to a remote device via a communications component 106. Application 103 may be accessed by processor 102 from any suitable source, such as from memory 104 (e.g., via bus 114) or from another device or server or any other suitable remote source via communications component 106. Processor 102 may include a single processor or multiple processors. For example, processor 102 may include at least one "general purpose" microprocessor, a combination of general and special purpose microprocessors, instruction set processors, graphics processors, video processors, and/or related chips sets, and/or special purpose microprocessors. Processor 102 also may include on board memory for caching purposes.

Electronic device 100 may also be provided with a housing 101 that may at least partially enclose one or more of the components of device 100 for protection from debris and other degrading forces external to device 100. In some embodiments, one or more of the components may be provided within its own housing (e.g., input component 110 may be an independent keyboard or mouse within its own housing that may wirelessly or through a wire communicate with processor 102, which may be provided within its own housing).

FIGS. 1A-1J are various views of various portions of electronic device 100 in accordance with some embodiments. As shown, electronic device 100 may include an ambient light sensing display assembly I/O interface 111a, which may include an ambient light sensor assembly input component 110a and a display assembly output component 112a with or without a touch screen assembly input component 110c, a button assembly input component 110, and an audio speaker assembly output component 112b, where housing 101 may be configured to at least partially enclose each of those input components and output components of device 100. Housing 101 may be any suitable shape and may include any suitable number of walls. In some embodiments, as shown in FIGS. 1A-1J, for example, housing 101 may be of a generally hexahedral shape and may include a top wall 101t, a bottom wall 101b that may be opposite top wall 101t, a left wall 101l, a right wall 101r that may be opposite left wall 101l, a front wall 101f, and a back wall 101k that may be opposite front wall 101f, where at least a portion of light sensing display assembly I/O interface 111a may be at least partially exposed to the external environment via an opening 109a through front wall 101f, where at least a portion of button assembly input component 110b may be at least partially exposed to the external environment via an opening 109b through front wall 101f, and where at least a portion of audio speaker assembly output component 112b may be at least partially exposed to the external environment via an opening 109c through front wall 101f. It is to be understood that electronic device 100 may be provided with any suitable size or shape with any suitable number and type of components other than as shown in FIGS. 1A-1J, and that the embodiments of FIGS. 1A-1J are only exemplary.

Figure 1C:
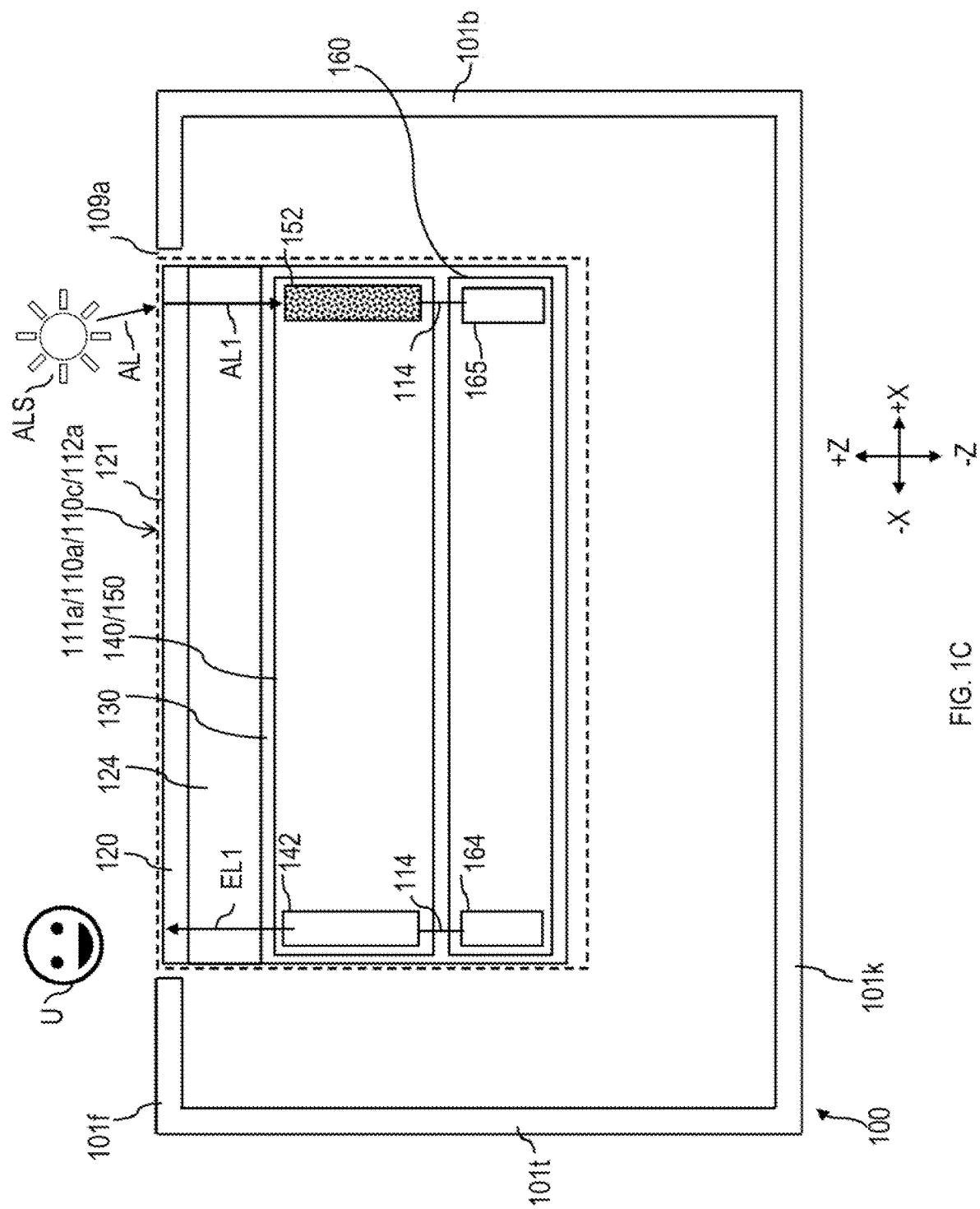
FIG. 1C is a cross-sectional view, taken from line IC-IC of FIG. 1A, of the electronic device of FIGS. 1-1B, in accordance with some embodiments.

As shown in FIG. 1C, I/O interface assembly 111a may include an external component 120 that may provide an external surface 121 that may be exposed to the external environment of electronic device 100 via housing opening 109a, such that external surface 121 may be touched or otherwise affected by a user U or any other object or element (e.g., fluid, heat, ambient light (e.g., any suitable ambient light AL from any suitable ambient light source ALS), etc.) of the external environment of electronic device 100. In some embodiments, external component 120 may be a cover glass (e.g., an alkali-aluminosilicate sheet toughened glass, sapphire glass, etc.) or any other suitable material structure that may provide external surface 121 suitable for interfacing with the external environment and/or suitable for receiving ambient light thereon and/or therethrough (e.g., for detection by any suitable circuitry of device 100) and/or transmitting light therethrough and/or therefrom (e.g., for detection by user U or any other object of the external environment), where the material structure may include any suitable coating thereon (e.g., an oleophobic coating that may reduce the accumulation of fingerprints on external surface 121).

Figure 1D:
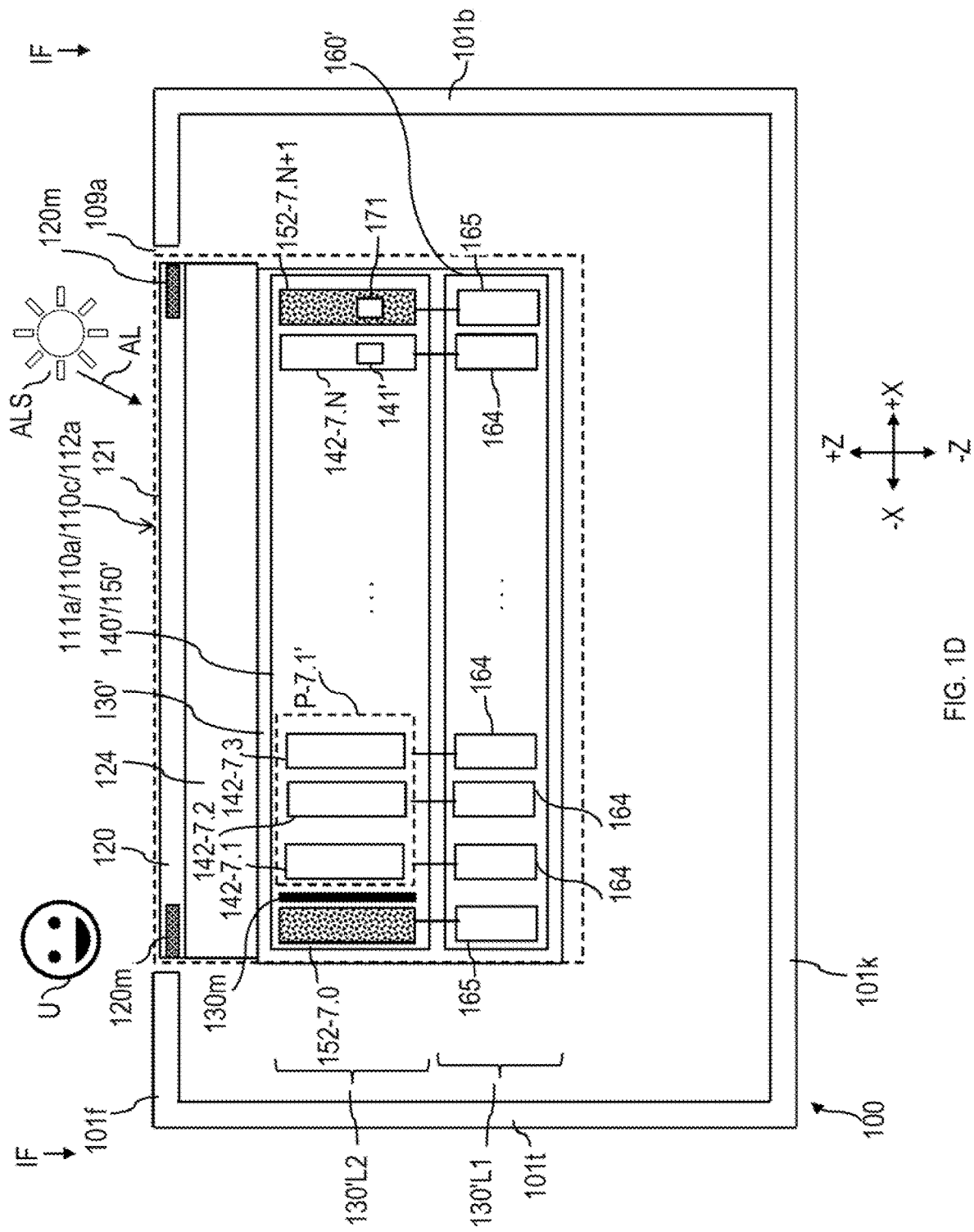
FIG. 1D is a cross-sectional view, similar to FIG. 1C, of the electronic device of FIGS. 1-1C, but with a particular light sensing display assembly, in accordance with some embodiments.
Figure 1E:
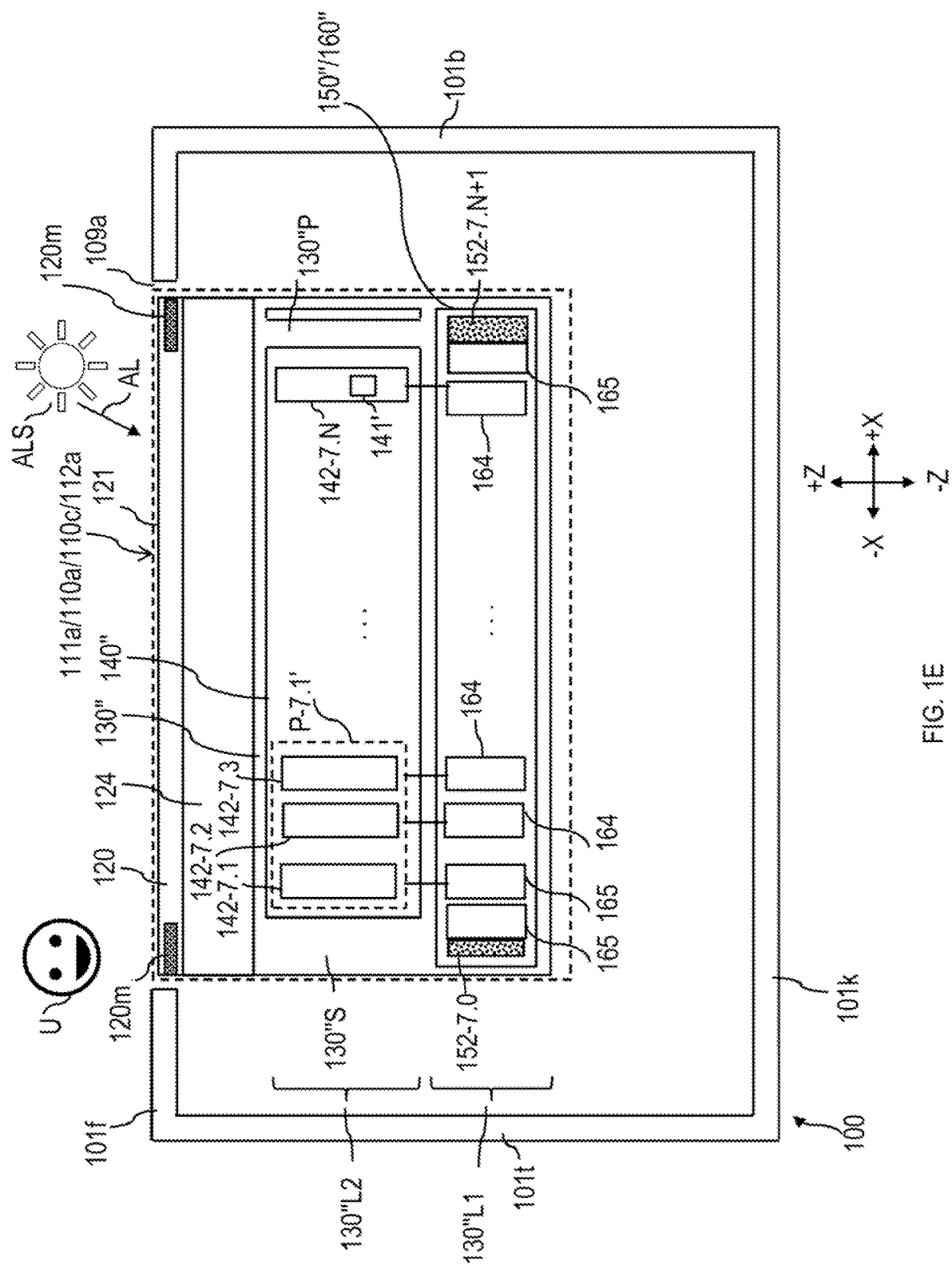
FIG. 1E is a cross-sectional view, similar to FIGS. 1C and 1D, of the electronic device of FIGS. 1-1C, but with another particular light sensing display assembly, in accordance with some embodiments.

I/O interface assembly 111a may include a display assembly 130 (e.g., of display assembly output component 112a) underneath external component 120. Display assembly 130 may be any suitable display assembly type that may include a light-emitting subassembly 140 that may be operative to generate and emit light that may be used to selectively illuminate at least a portion of external surface 121 (e.g., along the direction of arrow EL1, such as to emit light through external surface 121 (e.g., towards user U of device 100)). Light-emitting subassembly 140 may include at least one light-emitting diode or any other suitable light-emitting or light-generating element or light-generating component 142. Power supply 108 may be configured to provide power selectively to one, some, or each light-generating component 142 for enabling the generation and emittance of light therefrom (e.g., via any suitable light-generating selection circuitry (e.g., via any suitable light-generating selection circuitry 164 of a selection subassembly 160 of display assembly 130 that may be electrically coupled to the light-generating component via any suitable coupling (e.g., bus 114))). In some embodiments, as shown in FIG. 1I, for example, light-generating component 142 may include any suitable light-emitting element 141 (e.g., any suitable light emitting diode D) with a first pin or node 141a and a second pin or node 141b that may be coupled to circuitry 164, which may include a first node O1 and a second node O2. As shown, a current (e.g., current I) may flow through light-generating component 142 (e.g., as may be enabled by a power supply coupled to nodes O1 and O2 of circuitry 164 or as may be enabled by a current source component 160i of circuitry 164). Moreover, in some embodiments, as shown, for example, circuitry 164 may include any resistance element 160r or combination of resistance elements (e.g., any suitable resistor R), which may be provided (e.g., in series with light-emitting element 141) with a particular resistance for enabling an appropriate value for the operating current of light-generating component 142, such that light (e.g., light EL) may be emitted from a semiconductor junction J or otherwise of light-emitting element 141 (e.g., at a p-n junction or otherwise of anode A and cathode C of light emitting diode D). A forward voltage $V_f$ of light-generating component 142 (e.g., of light-emitting element 141) may be detected or otherwise measured (e.g., across nodes 141a and 141b) by circuitry 164 (e.g., alone or in combination with any other suitable circuitry of selection subassembly 160 and/or with any suitable processing by processor 102). Light-generating component 142 may include any suitable light-emitting element 141, which may be any suitable light-emitting diode, including, but not limited to, an inorganic light-emitting diode, an organic light-emitting diode, a high brightness light-emitting diode, a micro-light-emitting diode, a nano-light-emitting diode, and the like. In some embodiments, node O2 may be coupled to ground or any other suitable element. While FIG. 1I may show circuitry 164 to include a high side current source (e.g., current source component 160i may be coupled to anode A of LED D), circuitry 164 may include a low side current sink (e.g., a current sink may be operative to pull current from light-emitting element 141 (e.g., from cathode C of LED D)).

Display assembly 130 may include one or more other components, such as any suitable light-generating selection circuitry 164 of selection subassembly 160 that may be operative to selectively address individual display pixels or display subpixels of the display. For example, light-generating selection circuitry 164 or otherwise of selection subassembly 160 may include any suitable active matrix or passive matrix that may be electrically controlled (e.g., on a row by row or column by column or pixel by pixel basis) to selectively transmit therethrough and towards a particular portion of external surface 121 any light emitted from any light-generating component(s) 142 of light-emitting subassembly 140 (e.g., if such a portion of selection subassembly 160 is positioned between light-emitting subassembly 140 and external component 120 or at any other suitable location of I/O interface assembly 111a) and/or to selectively drive or otherwise enable one or more light-generating components 142 of light-emitting subassembly 140 to emit light towards external surface 121 (e.g., if light-emitting subassembly 140 is positioned between such a portion of selection subassembly 160 and external component 120 (e.g., in a top-emission structure) and/or if light-emitting subassembly 140 is positioned adjacent such a portion of selection subassembly 160 (e.g., in a coplanar bottom-emission structure) or at any other suitable location of I/O interface assembly 111a). Moreover, in some embodiments, as shown in FIG. 1C, for example, I/O interface assembly 111a (e.g., touch assembly input component 110c) may include a touch sensing assembly 124 (e.g., between external component 120 and display assembly 130, or at any other suitable location of I/O interface assembly 111a), where touch sensing assembly 124 may be any suitable assembly operative to detect the position of one or more touch events or near touch events (e.g., by user U or any other suitable object in the external environment of device 100) along external surface 121 (e.g., a resistive touchscreen, a surface acoustic wave touchscreen, a capacitive sensing touchscreen, an infrared touchscreen, an acoustic pulse recognition touchscreen, etc.). In some embodiments, display assembly 130 may be described as including or being provided with touch sensing assembly 124. Additionally or alternatively, in some embodiments, display assembly 130 may be described as including or being provided with external component 120.

It is to be understood that, although I/O interface 111a has been described with respect to a "display" output component 112a and a "display" assembly 130, in some embodiments, such features may be operative to provide illumination of external surface 121 (e.g., to emit light through external surface 121) for general illumination purposes, decorative purposes, or simple informational purposes rather than as a conventional display for high-resolution informational purposes. For example, one or more light-generating components 142 of light-emitting subassembly 140 may be operative to illuminate external surface 121 of external component 120 that may be provided through an opening in housing 101 in the shape of a logo (e.g., through back wall 101k) when device 100 is turned on (e.g., a light-up logo on the back of a laptop computer). In such embodiments, only a single light-generating component 142 or a limited number of light-generating components 142 may need to be provided by light-emitting subassembly 140.

I/O interface 111a may also include any suitable ambient light-sensing subassembly 150 (e.g., of ambient light sensor assembly input component 110a) underneath external component 120. Light-sensing subassembly 150 may be provided by or in combination or in conjunction with any suitable display assembly 130. Light-sensing subassembly 150 may be any suitable light sensor assembly type that may be operative to receive and detect any suitable portion of ambient light AL from any suitable ambient light source(s) ALS in the environment of device 100 via external component 120 (e.g., in the direction of arrow AL1) and/or any suitable portion of internal light IL from any suitable internal light source(s) internal to device 100 (e.g., within housing 101), such as any suitable light from any suitable light-generating component 142 (e.g., a portion of emitted light EL). As shown in FIG. 1J, for example, light-sensing subassembly 150 may include at least one light-detecting diode or any other suitable light-detecting element or light-detecting component 152. Power supply 108 may be configured to selectively interact with one, some, or each light-detecting component 152 for enabling the detection of light thereat (e.g., via any suitable light-detecting selection circuitry (e.g., via any suitable light-detecting selection circuitry 165 of selection subassembly 160 that may be electrically coupled to the light-detecting component via any suitable coupling (e.g., bus 114))). Light-detecting component 152 may include any suitable light-detecting element 151 (e.g., any suitable light-detecting diode PD (e.g., a photodiode)) with at least two pins or nodes 151*a* and 151*b* that may be electrically coupled with circuitry 165 of selection subassembly 160, which may include a first node O3 and a second node O4. A voltage may be applied or measured across nodes O3 and O4. For example, light-detecting element 151 may be biased (e.g., reverse biased) with an external voltage V (e.g., a calibration power characteristic value of voltage V of light-detecting element 151), during which incoming detected ambient light AL may increase the current (e.g., reverse current) flowing through light-detecting element 151, and such a magnitude of such current may be detected (e.g., by circuitry 165 of selection subassembly 160) for determining a current brightness of light AL (e.g., light-detecting element 151 itself may not be generating energy but may be modulating the flow of energy from an external source, where such a mode may be referred to as a photoconductive mode). A magnitude of a current flowing through light-detecting component 152 (e.g., as may be varied by the magnitude of light AL detected by diode PD of light-detecting element 151 of light-detecting component 152 when voltage V is applied across element 151 (e.g., at a semiconductor junction J or otherwise of light-detecting element 151 (e.g., at a junction or otherwise of anode A and cathode C of light detecting diode PD))) may be detected by circuitry 165 of selection subassembly 160 in any suitable manner (e.g., using any suitable circuitry components of circuitry 165 of selection subassembly 160 and/or processing capabilities of processor 102), and such a detected magnitude of current may be used (e.g., by processor 102 (e.g., to determine any suitable characteristic of ambient light in an environment of device 100)). As another example, in the absence of external bias, light-detecting element 151 may be operative to convert the energy of light AL into electric energy by charging the terminals of light-detecting element 151 to a voltage (e.g., integrated onto the light-detecting element's capacitance), whereby the rate of charge (e.g., as may be detected by circuitry 165 of a selection subassembly 160) may be proportional to the intensity or brightness of incoming light AL (e.g., the energy may be harvested and then measured by draining the charge through an external high-impedance path (e.g., through use of a switch 160*s* of circuitry 165 of selection subassembly 160), where such a mode may be referred to as a photovoltaic mode). As just one particular embodiment of circuitry 165 of selection subassembly 160, as shown in FIG. 1J, circuitry 165 may include a transimpedance amplifier or any other suitable component, which may include an amplifier component 160*p* (e.g., a charge amplifier), where an inverting input of amplifier component 160*p* may be coupled to node 151*a*, a non-inverting input of amplifier component 160*p* may be coupled to node O3, and the output of amplifier component 160*p* may be coupled to the inverting input of amplifier component 160*p* and to cathode C of light-detecting element 151 via a filter component 160*f*, which may include a resistor-capacitor circuit RC. In some embodiments, switch 160*s* may be provided to selectively couple or decouple cathode C to and from the inverting input of amplifier component 160*p*. A voltage V (e.g., a constant voltage) may be applied to node O3 and a current through light-detecting element 151 may be detected or a voltage of circuitry 165 from light-detecting element 151 may be detected that may be proportional to the current through light-detecting element 151.

Display assembly 130 may include one or more other components, such as any suitable light-detecting selection circuitry 165 of selection subassembly 160 that may be operative to selectively address individual sensor pixels or sensor subpixels of the display. For example, light-detecting selection circuitry 165 or otherwise of selection subassembly 160 may include any suitable active matrix or passive matrix that may be electrically controlled (e.g., on a row by row or column by column or pixel by pixel basis) to selectively enable detection of any light received by any light-detecting component(s) 152 of light-sensing subassembly 150).

I/O interface 111*a* may include any suitable type of display assembly 130 with any suitable combination of any suitable type of light-emitting subassembly 140 and any suitable type of light-sensing subassembly 150 and any suitable type of selection subassembly 160. Any suitable combination of one or more light-generating components 142 of any suitable light-emitting subassembly 140 and one or more light-detecting components 152 of any suitable of light-sensing subassembly 150 and any suitable selection subassembly 160 may be combined to provide display assembly 130 of I/O interface 111*a* that may be operative not only to emit internally generated light but also to detect ambient light (e.g., simultaneously, alternatingly, or otherwise selectively (e.g., through control of selection subassembly 160 by any suitable processing (e.g., through use of any suitable application 103 being run by processor 102)). Each light-detecting component 152 of light-sensing subassembly 150 may be positioned in a single layer or different light-detecting components 152 of light-sensing subassembly 150 may be positioned in different layers. Light-emitting subassembly 140 may be, for example, a liquid crystal display (LCD display) or an organic light emitting diode display (OLED display) or any other suitable type of display panel. Other types of displays can also be used. One, some, or each light-detecting component 152 of light-sensing subassembly 150 may be provided or otherwise positioned in the same layer as one, some, or each light-generating component 142 of light-emitting subassembly 140. For example, one, some, or each light-detecting component 152 of light-sensing subassembly 150 may be provided or otherwise positioned in a layer that may also include one or more of the LEDs (e.g., organic element(s)) of an OLED display light-emitting subassembly 140 or one or more of the pixel cells of an LCD display light-emitting subassembly 140 (e.g., as shown in FIG. 1D). Alternatively or additionally, one, some, or each light-detecting component 152 of light-sensing subassembly 150 may be provided by the same component as one, some, or each respective light-generating component 142 of light-emitting subassembly 140. For example, a single diode element may be provided as both a light-emitting element 141 of a light-generating component 142 of light-emitting subassembly 140 and a light-detecting element 151 of a light-detecting component 152 of light-sensing subassembly 150 (e.g., a single diode may be configured as an LED based on a first interaction or a first electrical coupling/decoupling with certain selection circuitry of selection subassembly 160 and as a PD based on a second interaction or a second electrical coupling/decoupling with certain selection circuitry of selection subassembly 160, where device 100 may be configured to selectively alternate between such first and second interactions (e.g., through control of selection subassembly 160 by any suitable processing (e.g., through use of any suitable application 103 being run by processor 102)). As just one example, a particular OLED light-emitting element 141 (e.g., an OLED that may be configured with Tris (8-hydroxyquinolinato) aluminium (Al (C9H6NO) 3 or Al3) or any other suitable material (e.g., as an amorphous molecular organic thin film)) may be operative to emit green light but also be sensitive for detecting blue light as a light-detecting element 151 (e.g., due to the phenomena of the Stoke's Shift and/or the Franck Condon principle). For example, one or more of light-detecting components 152 of one or more of FIGS. 1D, 1F, 1G, and 1H may be provided by a light-generating component 142 that includes such a light-emitting element 141 that may also be configured by selection subassembly 160 as a light-detecting element 151 (e.g., as shown by a light-emitting/light-detecting element 171 of component 152-7.N+1 [152 7.N+1] of FIG. 1D that may be selectively operative (e.g., by selection assembly 160 and/or processor 102) as either a light-emitting element 141 or a light-detecting element 151). Alternatively or additionally, one, some, or each light-detecting component 152 of light-sensing subassembly 150 may be provided or otherwise positioned in a different layer than one, some, or each light-generating component 142 of light-emitting subassembly 140. For example, one, some, or each light-detecting component 152 of light-sensing subassembly 150 may be provided or otherwise positioned in a layer of selection subassembly 160 (e.g., in a layer including a thin-film-transistor ("TFT") backplane or array (e.g., of an OLED display light-emitting subassembly 140 or of an LCD display light-emitting subassembly 140)) rather than in a layer including one or more of the LEDs (e.g., organic element(s)) of an OLED display light-emitting subassembly 140 or one or more of the pixel cells of an LCD display light-emitting subassembly 140. In such embodiments, a hole or cut out may be provided through such a layer of light-emitting subassembly 140 (e.g., through a layer including one or more of the LEDs (e.g., organic element(s)) of an OLED display light-emitting subassembly 140 or one or more of the pixel cells of an LCD display light-emitting subassembly 140) and/or such a layer of light-emitting subassembly 140 may be terminated such that a portion of the layer of selection subassembly 160 providing one or more of light-detecting components 152 may not be blocked by such a layer of light-emitting subassembly 140 (e.g., such that ambient light may be received by that portion of the layer of selection subassembly 160 providing one or more of light-detecting components 152) (e.g., as shown by a space 130"S created by an early termination of layer 130"L2 in the −X direction of FIG. 1E and/or by a passageway 130"P provided through layer 130"L2 of FIG. 1E). Functionalities of light-emitting subassembly 140 and functionalities of light-sensing subassembly 150 can both be provided in a TFT layer (e.g., of an LCD type display assembly 130 and/or of an LED type display assembly 130). Additionally or alternatively, functionalities of light-emitting subassembly 140 and functionalities of light-sensing subassembly 150 can both be provided in an LED layer (e.g., of an OLED display assembly 130).

Figure 1F:
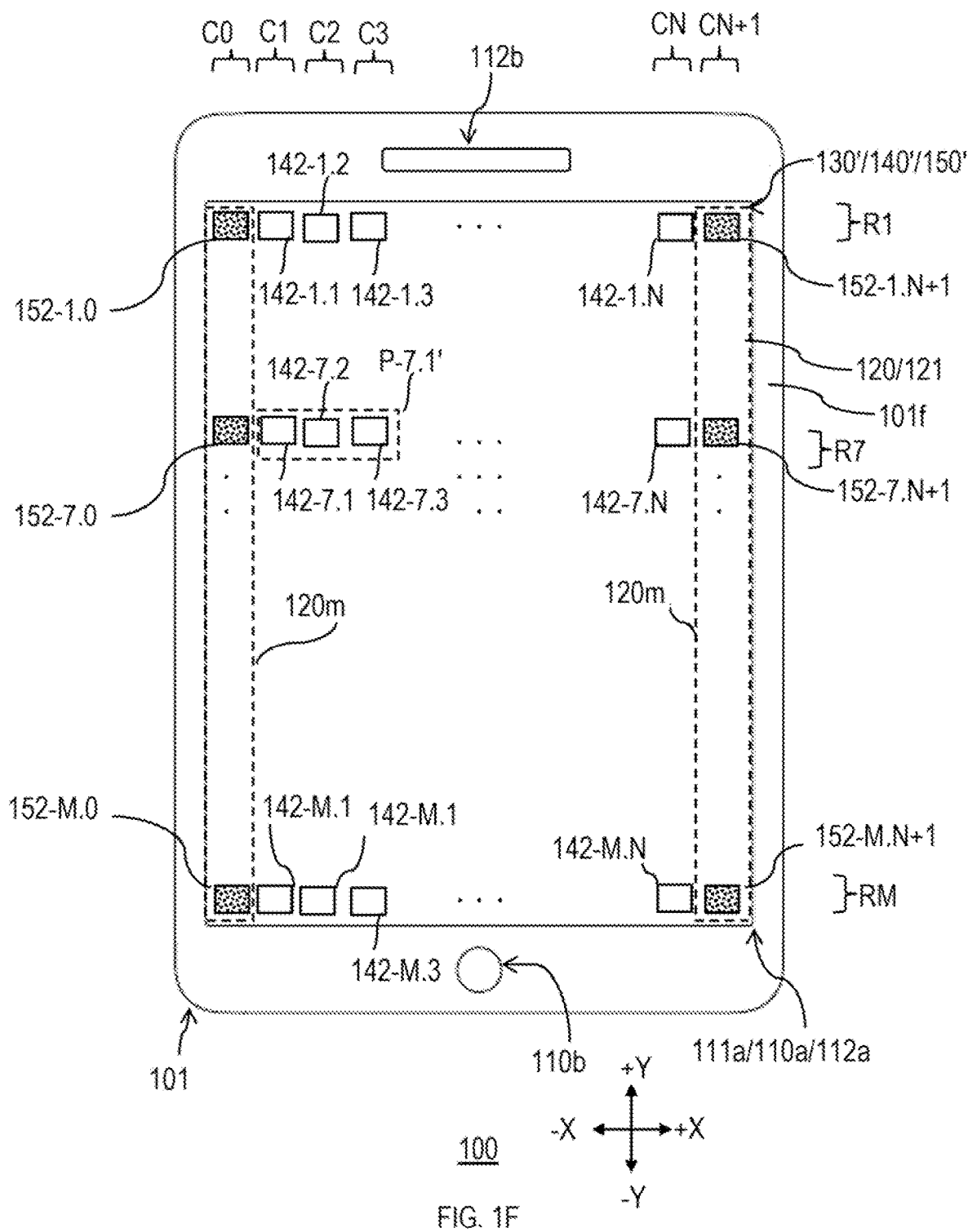
FIG. 1F is a front view, taken from line IF-IF of FIG. 1D, of the electronic device of FIGS. 1-1D, in accordance with some embodiments.

As an example of a particular type of display assembly that may be provided by display assembly output component 112a, as shown in FIGS. 1D and 1F, a display assembly 130' may be a light-emitting diode ("LED") display assembly or any other suitable display assembly type that may use an array of light-generating components 142 provided by a light-emitting subassembly 140' as pixels for the display. For example, as shown in FIGS. 1D and 1F, light-emitting subassembly 140' of display assembly 130' may include an array of light-generating components 142 arranged in rows and columns (e.g., in a matrix) underneath all or at least a substantial portion of external surface 121 of external component 120, where each light-generating component 142 may be operative to emit light towards a particular portion of external surface 121. As just one example, as shown, light-emitting subassembly 140' of display assembly 130' may include an array or matrix of light-generating components 142 arranged in M rows R1-RM and N columns C1-CN, where row R1 may include light-generating components 142-1.1 through 142-1.N, row R7 may include light-generating components 142-7.1 through 142-7.N, and row M may include light-generating components 142-M.1 through 142-M.N, column C1 may include light-generating components 142-1.1 through 142-M.1, column C2 may include light-generating components 142-1.2 through 142-M.2, and column CN may include light-generating components 142-1.N through 142-M.N (see, e.g., FIG. 1F). Each light-generating component 142 of light-emitting subassembly 140' may be operative to emit light (e.g., along the +Z-axis) towards external component 120 for illuminating a particular pixel or a particular subset of pixels of display assembly 130'. Each light-generating component 142 of light-emitting subassembly 140' may be any suitable light-generating component 142 that may include any suitable light-emitting element 141, such as an OLED, nano-LED, micro-LED, and the like. For example, as shown in FIG. 1D, light-generating component 142-7.N may include a light-emitting element 141, which may include an LED cathode, above which may be positioned an electron transport layer ("ETL"), above which may be positioned an emissive layer ("EML"), above which may be positioned a hole transport layer ("HTL"), above which may be positioned an LED anode, which may be operative to emit light (e.g., when device 100 provides a current for flowing from the cathode to the anode). In some embodiments, each one of any two or more light-generating components 142 may be provided as a display subpixel and may be combined to provide a single display pixel. For example, three adjacent (e.g., horizontally adjacent, vertically adjacent, and/or otherwise adjacent) components 142 may be provided as display subpixels (e.g., red, green, and blue display subpixels) of a display pixel. As shown, for example, adjacent components 142-7.1, 142-7.2, and 142-7.3 may be display subpixels defining a display pixel P-7.1'.

Display subassembly 130' may also include a selection subassembly 160' that may be operative to selectively enable transmission of light from a particular light-generating component 142 of light-emitting subassembly 140' towards external surface 121 (e.g., an active or passive matrix that may be electrically controlled (e.g., on a pixel by pixel basis and/or on a row by row or column by column basis) to selectively transmit light from one or more respective light-generating components 142 of light-emitting subassembly 140' towards a respective portion of external surface 121 (e.g., using one or more respective circuitries 164 or otherwise of selection subassembly 160')). For example, display subassembly 130' may be an LED display assembly with a selection subassembly 160' that may include an active matrix, which may be realized using a thin-film-transistor ("TFT") backplane or array, for addressing individual pixels, although any suitable selection assembly may be provided by display subassembly 130' either above, below, or integrated with light-emitting subassembly 140'. By controlling each pixel of display assembly 130' with selection subassembly 160' (e.g., via a display application being run by processor 102), a varying amount of light emitted by each respective light-generating component 142 of light-emitting subassembly 140' may be selectively allowed to illuminate a respective portion of external surface 121.

In some embodiments, as shown in FIG. 1D, for example, I/O interface assembly 111a (e.g., touch assembly input component 110c) may include touch sensing assembly 124 between external component 120 and display assembly 130' (e.g., between external component 120 and selection subassembly 160') or at any other suitable location of I/O interface assembly 111a of FIGS. 1D and 1F, where touch sensing assembly 124 may be any suitable assembly operative to detect the position of one or more touch events or near touch events (e.g., by user U or any other suitable object in the external environment of device 100) along external surface 121 (e.g., a resistive touchscreen, a surface acoustic wave touchscreen, a capacitive sensing touchscreen, an infrared touchscreen, an acoustic pulse recognition touchscreen, etc.). In some embodiments, display assembly 130' may be described as including or being provided with touch sensing assembly 124. Additionally or alternatively, in some embodiments, display assembly 130' may be described as including or being provided with external component 120.

Additionally, as shown in FIGS. 1D and 1F, for example, display assembly 130' of I/O interface assembly 111a may include a light-sensing subassembly 150' with one or more light-detecting components 152 that may be in the same plane as one or more light-generating components 142 of light-emitting subassembly 140'. For example, while one, some, or each one of light-generating components 142 of light-emitting subassembly 140' may include an LED element 141 (e.g., an organic LED (OLED) element), one, some, or each one of light-detecting components 152 of light-sensing subassembly 150' may include a photodiode element 151 (e.g., organic photodiode (OPD) element), and those elements 141 and 151 may be in the same plane or layer (e.g., with respect to the Z-axis). For example, as shown, light-generating components 142 of light-emitting subassembly 140' and light-detecting components 152 of light-sensing subassembly 150' may be provided in the same display assembly layer 130'L2 of display assembly 130' (e.g., in the same organic layer(s) for organic diode elements of those components (e.g., above or below display assembly layer 130'L1 of display assembly 130' in which any or all suitable circuitry of selection subassembly 160' (e.g., thin-film-transistor ("TFT") backplane or array and/or circuitries 164 and/or 165) may be provided)). In such a layer 130'L2, as shown, a first light-detecting component 152 may be provided just adjacent to the –X-most light-generating component 142 in the –X direction along the X-axis of each one of rows R1-RM (e.g., for providing a light-emitting component 142 in each row along a column C0) and a second light-detecting component 152 may be provided just adjacent to the +X-most light-emitting component 142 in the +X direction along the X-axis of each one of rows R1-RM (e.g., for providing a light-generating component 142 in each row along a column CN+1). By providing light-detecting components 152 of display assembly 130' along the edges (e.g., along leftmost and rightmost columns (and/or along topmost and/or bottommost rows)) of an array or matrix of components 142/152, one, some, or each light-detecting component 152 may be positioned under any suitable masked portion 120m of surface component 120 of I/O interface 111a. Such an opaque masking layer (e.g., a layer of black ink (e.g., a polymer filled with carbon black or a layer of any suitable opaque metal)) may be provided to help hide one or more of components 152 from the sight of user U (e.g., when those components 152 may be configured only for light detection rather than also for light emission), where such a layer may be configured to allow any suitable ambient light AL to pass therethrough for detection by one or more components 152 while at least partially preventing user U from seeing component(s) 152. However, if a component 152 may also be configured to selectively act as a light-generating component (e.g., component 152-7.N+1 with a light-emitting/light-detecting element 171), then a masked portion may not be provided above such a component. Although light-detecting components 152 may be shown only to be provided in edge columns C0 and CN+1, it is to be understood that two or more adjacent edge columns may be provided to include light-detecting components 152, and/or light-detecting components may also be provided along edge rows R1 and RM such that light-detecting components 152 may be provided about the entire boarder or substantially the entire boarder of an array of light-generating components 142 (e.g., where a mask (e.g., mask 120m) may also extend about the entire boarder). At least when one or more light-detecting components 152 may be provided along at least one edge or otherwise not interspersed between various light-generating components 142, such light-detecting components 152 may be used for detecting ambient light from any suitable ambient light source(s) concurrently with such light-generating components 142 being used for emitting any suitable display light for the user, where any suitable mask element (e.g., element 130m of FIG. 1D) may be positioned between any two adjacent light-generating and light-detecting components for limiting light generated by the light-generating component from being detected as ambient light by the light-detecting component.

Therefore, in some embodiments, one or more dedicated or specifically configured light-detecting components 152 may be provided in the same layer 130'L2 as one or more dedicated or specifically configured light-generating components 142, which may enable more efficient manufacturing of assembly 130' (e.g., a manufacturing process for providing a layer 130'L2 with one or more OLED light-generating components 142 may not be significantly disrupted by adding one or more OPD light-detecting components 152 to that same layer during the manufacturing process. Moreover, one or more dedicated or specifically configured light-detecting selection circuitries 165 may be provided in the same layer 130'L1 as one or more dedicated or specifically configured light-generating selection circuitries 164, which may enable more efficient manufacturing of assembly 130' (e.g., a manufacturing process for providing layer 130'L1 with one or more light-generating selection circuitries 164 may not be significantly disrupted by adding one or more light-detecting selection circuitries 165 to that same layer during the manufacturing process (e.g., extending traces and/or columns and/or rows of an active or passive selection control matrix, which may be realized using a single thin-film-transistor ("TFT") backplane or array or the like). This may enable a more streamlined manufacturing process and more real-estate efficient display assembly.

Figure 1G:
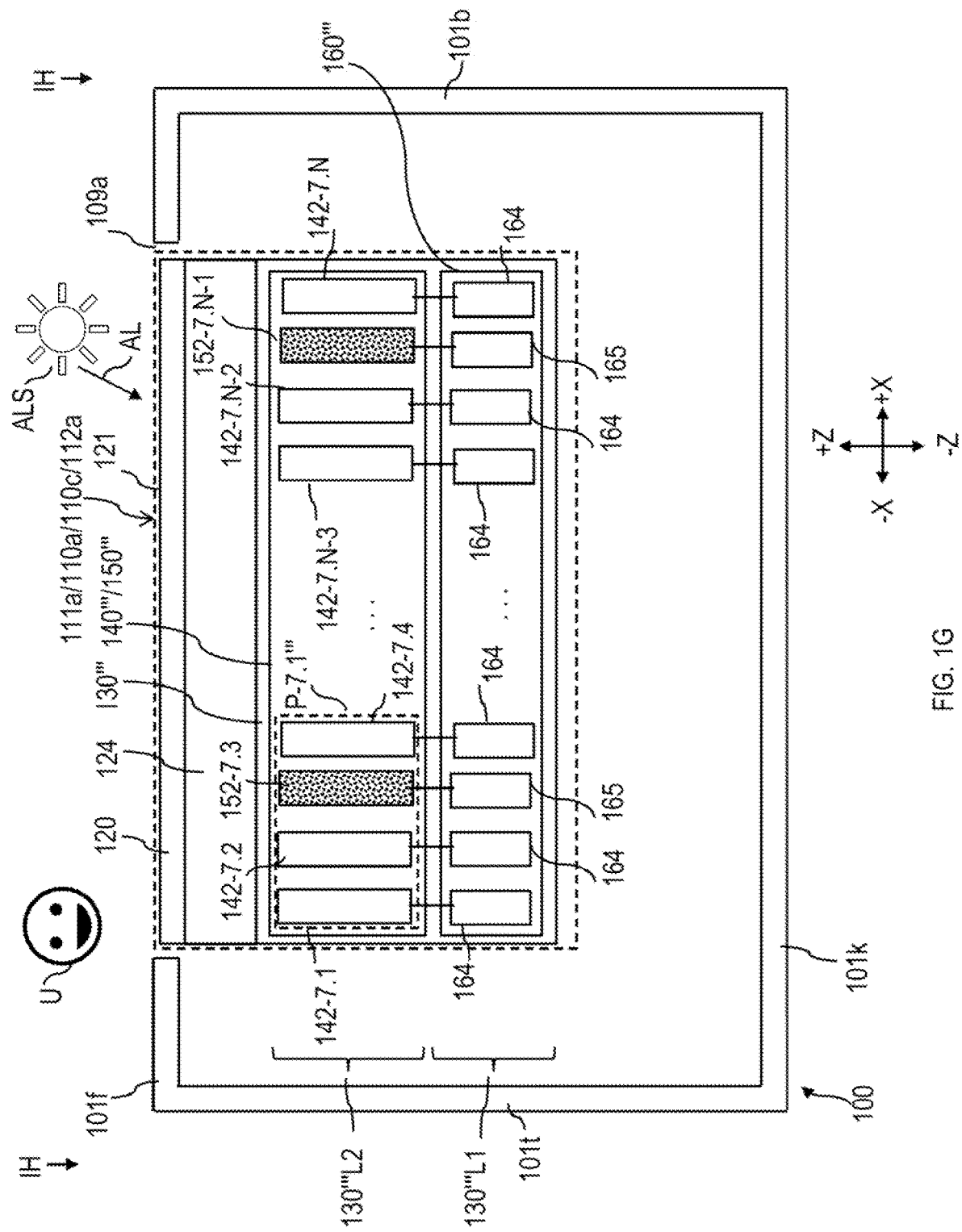
FIG. 1G is a cross-sectional view, similar to FIGS. 1C, 1D, and 1E, of the electronic device of FIGS. 1-1C, but with another particular light sensing display assembly, in accordance with some embodiments.
Figure 1H:
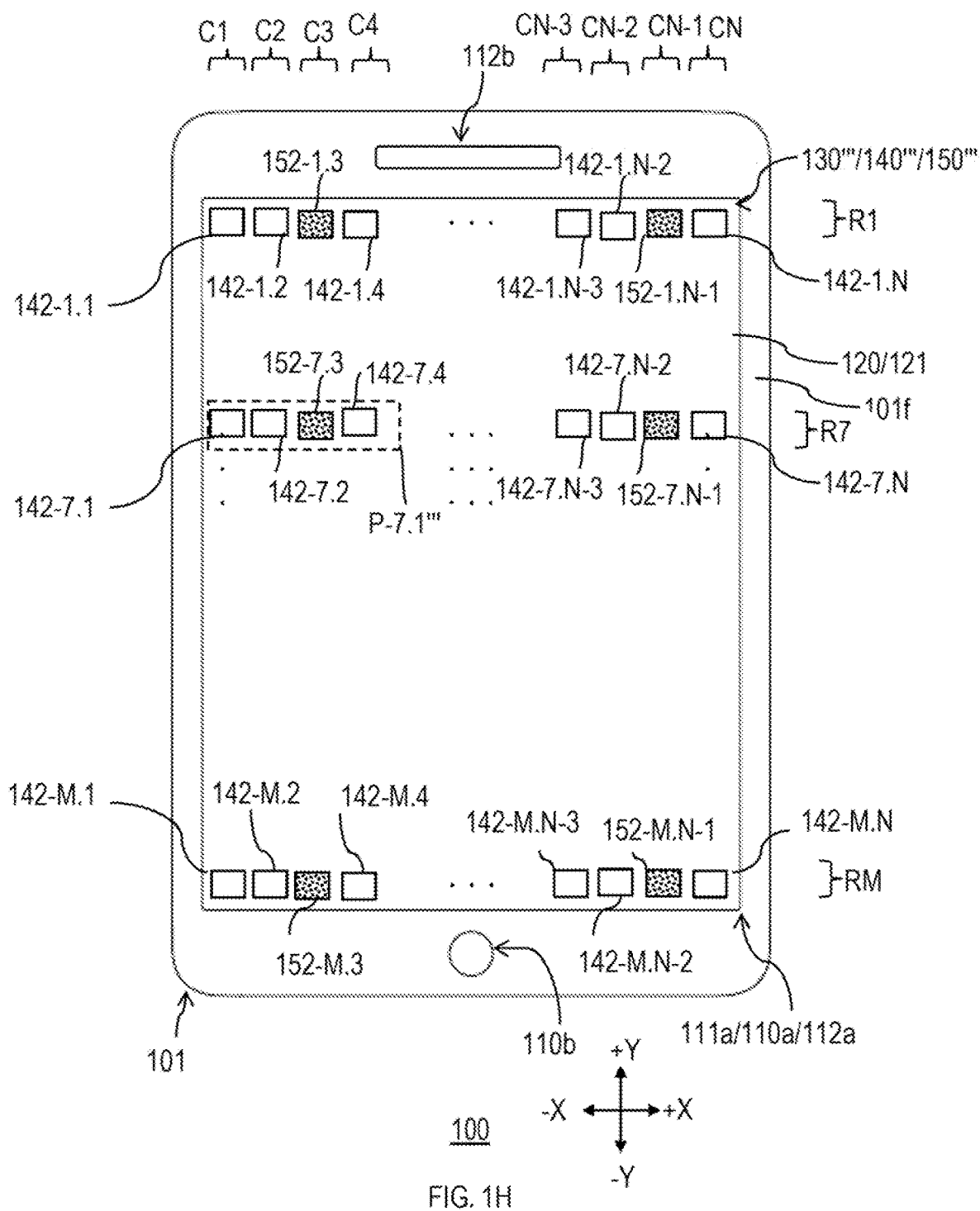
FIG. 1H is a front view, taken from line IH-IH of FIG. 1G, of the electronic device of FIGS. 1-1C and 1G, in accordance with some embodiments.
Figure 1I:
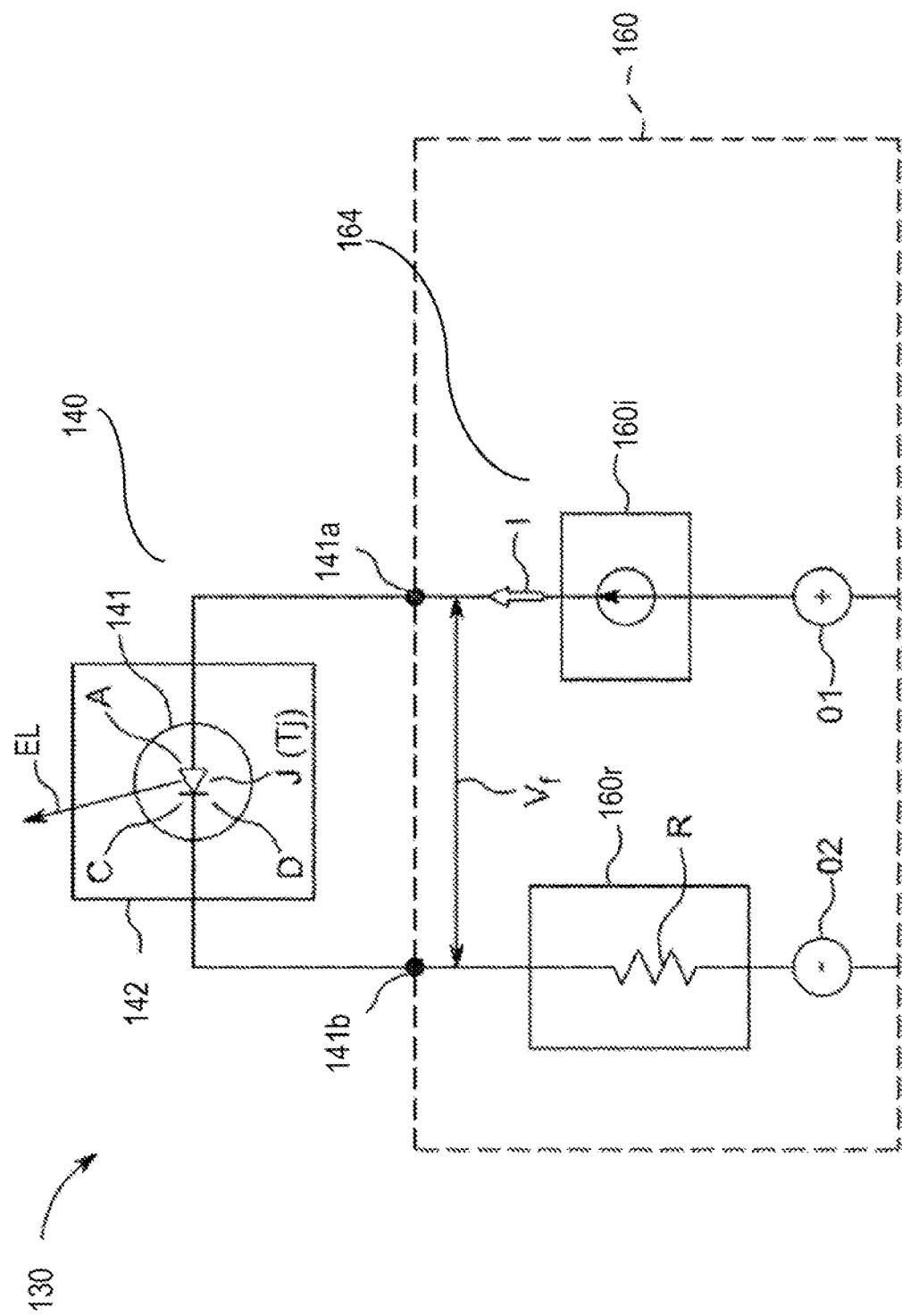
FIG. 1I is a schematic view of an exemplary light-generating component of the display assembly of the electronic device of FIGS. 1-1H, in accordance with some embodiments.
Figure 1J:
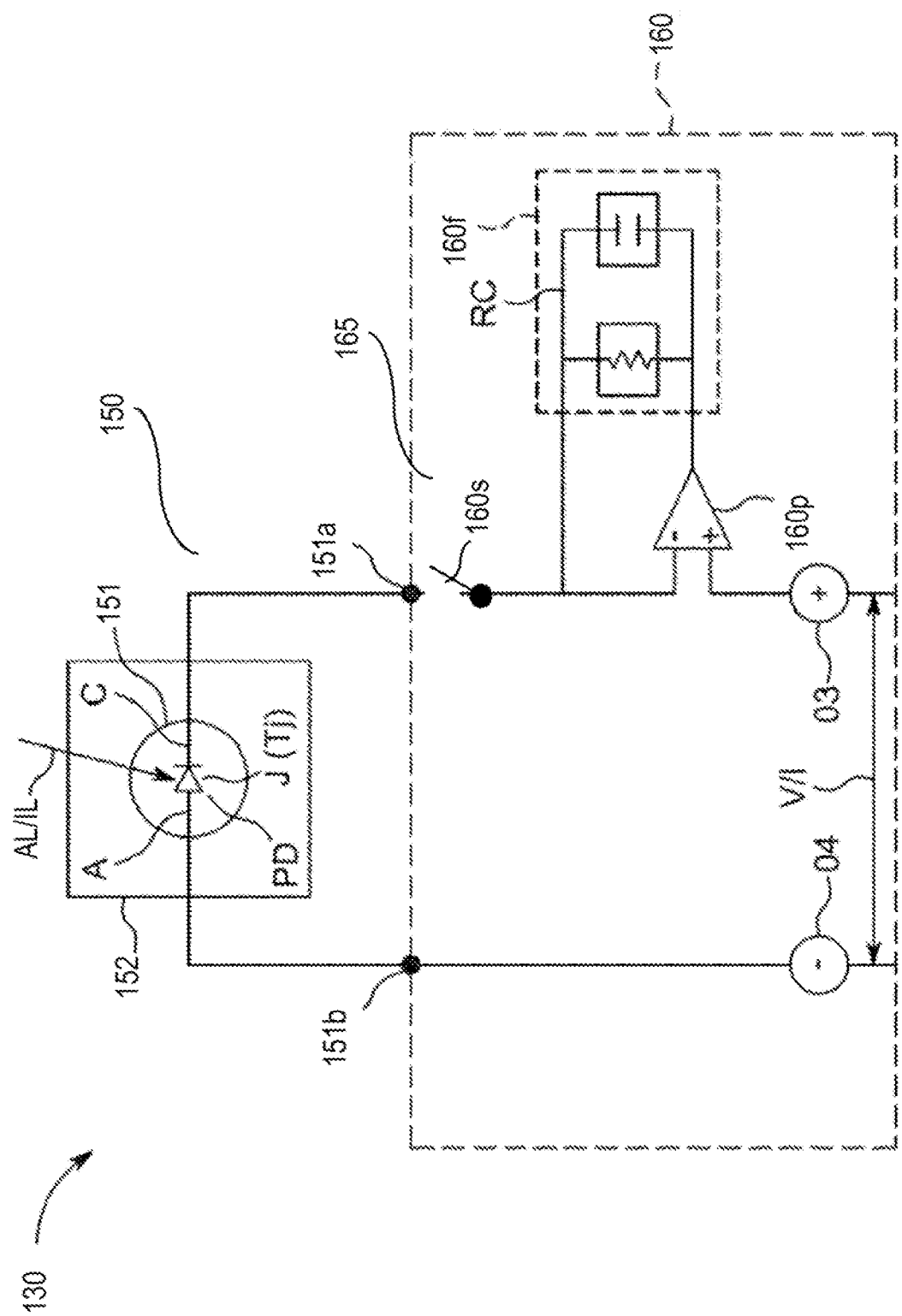
FIG. 1J is a schematic view of an exemplary light-detecting component of the display assembly of the electronic device of FIGS. 1-1H, in accordance with some embodiments.

As another example of a particular type of display assembly that may be provided by display assembly output component 112a, as shown in FIGS. 1G and 1H, a display assembly 130' may be a light-emitting diode ("LED") display assembly or any other suitable display assembly type that may use an array of light-generating components 142 provided by a light-emitting subassembly 140" as pixels for the display. For example, as shown in FIGS. 1G and 1H, light-emitting subassembly 140''' of display assembly 130''' may include an array of light-generating components 142 and light-detecting components 152 of a light-sensing subassembly 150''' of display assembly 130''' arranged together in rows and columns (e.g., in a matrix) underneath all or at least a substantial portion of external surface 121 of external component 120. While a majority of display assembly 130''' of FIGS. G and H may be the same as display assembly 130' of FIGS. D and F, light-detecting components 152 of display assembly 130''' may be interspersed with light-generating components 142 within a layer 130'''L2 above layer 130'''L1 of display assembly 130''', as opposed to light-detecting components 152 of display assembly 130' that may be provided along one or more edges of display assembly 130 within layer 130'L2. Therefore, as shown, a light-detecting component 152 may be positioned in between two or more light-generating components 142, such that a display pixel may be configured to include a light-detecting component 152 (e.g., pixel P-7.1''') may include not only components 142-7.1, 142-7.2, and 142-7.4, but also component 152-7.3, which may or may not be configured like component 152-7.N+1 with a light-emitting/light-detecting element 171 that may be selectively operative (e.g., by selection assembly 160 and/or processor 102) as either a light-emitting element 141 or a light-detecting element 151) and/or such that two display pixels may be separated by a light-detecting component 152.

As another example of a particular type of display assembly that may be provided by display assembly output component 112a, as shown in FIG. 1E, a display assembly 130" may be a light-emitting diode ("LED") display assembly or any other suitable display assembly type that may use an array of light-generating components 142 provided by a light-emitting subassembly 140" as pixels for the display. For example, light-emitting subassembly 140" of display assembly 130" may include an array of light-generating components 142 and at least one light-detecting component 152 of a light-sensing subassembly 150" of display assembly 130" arranged together in rows and columns (e.g., in a matrix) underneath all or at least a substantial portion of external surface 121 of external component 120. While a majority of display assembly 130" of FIG. E may be the same as display assembly 130' of FIGS. D and F, any one or more of light-detecting components 152 of display assembly 130" may be provided by any suitable circuitry within in a different layer than a layer in which one, some, or each light-generating component 142 of light-emitting subassembly 140" may be provided (e.g., in a layer different from layer 130"L2 in which one or more or each light-generating component 142 of light-emitting subassembly 140" of display assembly 130" may be provided). For example, one, some, or each light-detecting component 152 of light-sensing subassembly 150" of display assembly 130" may be provided or otherwise positioned in a layer 130"L1 within which any suitable circuitry of selection subassembly 160" of display assembly 130" may be provided (e.g., in a layer including a thin-film-transistor ("TFT") backplane or array and/or circuitry 164 and/or circuitry 165 and/or the like of selection subassembly 160" of any suitable LED display assembly and/or of any LCD display assembly or any other suitable type of display assembly) rather than in a layer including one or more LEDs (e.g., organic element(s)) of an OLED display light-emitting subassembly 140" or one or more of pixel cells of an LCD display light-emitting subassembly 140". In such embodiments, as shown in FIG. 1E, a hole or cut or passageway 130"P may be provided at least partially or entirely through such a layer 130"L2 in which one or more or each light-generating component 142 of light-emitting subassembly 140" of display assembly 130" may be provided and/or a space 130"S may be created by an early termination of layer 130"L2 (e.g., in the direction of FIG. 1E), such that one or more portions of layer 130"L1 and/or at least one light-detecting component 152 of light-sensing subassembly 150" of display assembly 130" may not be blocked by such a layer 130"L2 (e.g., such that ambient light may be received by at least one light-detecting component 152 of light-sensing subassembly 150" of display assembly 130" that may be positioned below layer 130"L2 (e.g., within layer 130"L1) (e.g., such that at least a portion of ambient light AL may be received by light-detecting component 152-7.0 of light-sensing subassembly 150" of display assembly 130" may via space 130"S and/or such that at least a portion of ambient light AL may be received by light-detecting component 152-7.N+1 of light-sensing subassembly 150" of display assembly 130" may via passageway 130"P)). For example, at least a portion of component 152 and one or more elements of circuitry 165 and/or one or more elements of circuitry 164 and/or any other suitable circuitry of selection subassembly 160" may be provided in layer 130"L1. For example, each element of FIG. 1J may be provided in layer 130"L1 that may extend below layer 130"L2 in which at least a portion of component 142 of FIG. 1I may be provided. For example, at least a portion of a light-detecting component 152 may be provided as an amorphous silicon detector or any other suitable photosensitive circuitry in a TFT layer of a selection subassembly layer of the display assembly.

FIGS. 1D-1H are exemplary diagrams of certain ways in which one or more light-detecting components 152 may be interspersed with or otherwise positioned with respect to one or more light-generating components 142 in a display assembly of an electronic device (e.g., with respect to a Z-axis (e.g., with respect to one or more layers of the display assembly) and/or with respect to an X-axis and/or with respect to a Y-axis (e.g., with respect to a surface 121). In some embodiments, at least one light-generating component 142 may be at least partially provided by a TFT pixel circuit that may create magnetic field which control the liquid crystals in an LCD display. Additionally or alternatively, at least one light-generating component 142 may be at least partially provided by an organic LED in an OLED display. At least one light-detecting component 152 may be at least partially provided by a diode generally configured as a transmitting diode (e.g., an LED) but that may be selectively utilized as a receiving diode (e.g., a PD) and/or at least one light-detecting component 152 may be at least partially provided by a diode generally configured as a receiving diode (e.g., a PD) that may be designed and/or configured as a dedicated light-receiving feature of a display assembly. Different light-detecting components 152 can include different types of diodes (e.g., a first light-detecting component 152 (e.g., component 152-7.0) may be configured to include only a receiving diode while a second light-detecting component 152 (e.g., component 152-7.N+1) may be configured to include a transmitting/receiving diode (e.g., diode 171)). Alternatively, in some embodiments, a light-detecting component 152 may be configured to include at least two diodes, which may include at least one receiving diode and at least one transmitting diode and/or at least one transmitting/receiving diode.

Each light-detecting component 152 may be electrically coupled through one or more transmission lines to a controller (e.g., processor 102), which may be configured to send signals to cause any light-transmitting elements to transmit light and to receive any signals from any light-receiving elements. In some embodiments, the electrical coupling(s) can be such that each light-detecting component 152 can be individually controlled. As mentioned above, this can be achieved, for example, using the same technique utilized for connecting the display pixels of an LCD display (e.g., by using column and row transmission lines and connecting the column and row transmission lines to a transistor at each light-detecting component 152). In some embodiments, each light-detecting component 152 may use its own dedicated transmission line. In other embodiments, each light-detecting component 152 may share a transmission line with or of one or more neighboring light-detecting components 152 and/or each light-detecting component 152 may share a transmission line with or of one or more neighboring light-generating components 142.

The light-emitting and light-sensing functions of a display assembly may be time multiplexed. For example, one or more transmission lines can be used to control/energize one or more light-generating components 142 for a first time period, and then the transmission lines can be switched for controlling/energizing one or more light-detecting components 152 during a second time period. Thus, use for the light-emitting and light-sensing functions can alternate. This multiplexing can be performed at a sufficiently high frequency to prevent any noticeable flicker. As mentioned, at least one light-detecting component 152 can be combined with one or more light-generating components 142 in a single pixel, such as pixel P-7.1''' of display assembly 130''' of FIGS. 1G and 1H. Such a pixel P-7.1''' of display assembly 130''' may include a light-detecting cell and one or more light-emitting cells (e.g., a red display cell, a green display cell, and a blue display cell). Such a display assembly 130''' may be an LCD and/or TFT display, in which an LCD display, the R, G, and B cells or otherwise can be TFT pixel circuits that may create magnetic fields that may control the liquid crystals in an LCD display. Such a display assembly 130''' may be an OLED display, in which the R, G, and B cells or otherwise can be LEDs. In such embodiments of display assembly 130''', one, some or each one of components 142 and component 152 may be individually controllable and may be electrically coupled to a controller (e.g., processor 102) through dedicated transmission lines, or they can share transmission lines neighboring components. Components 142 and one or more components 152 can be operated concurrently or in a time multiplexed manner.

The various layouts of one or more of FIGS. 1C, 1D, 1E, 1F, 1G, and 1H may be a cost efficient way to add ambient light sensing functionality to a display assembly of an electronic device, as a display assembly may already be a requirement to provide display functionality to such an electronic device. Adding additional elements to a semiconductor layer of a display assembly (e.g., a layer including semiconductors of a selection subassembly of a display assembly and/or a layer including any semiconductors of a light-generating component) that must already be produced for the display assembly to present images to a user can represent a relatively low incremental cost. Furthermore, for certain OLED embodiments, it can be cost efficient to add light sensing functionality to an existing display, as this may only include adding one or more additional diodes (e.g., a dedicated PD and/or a combined PD/LED) in an OLED layer that already primarily includes diodes. The only difference may be that the added diodes may be primarily configured to receive light rather than transmit light. Each light-detecting component 152 may be operative to detect ambient light that may be received via a portion of external component 120 that may be proximate to that light-detecting component 152. In some embodiments, one or more light-detecting components 152 may be selectively disabled and enabled. Thus, any suitable controller of device 100 (e.g., processor 102) may be configured to selectively vary the number of active light-detecting component 152 in order to save power (e.g., by reducing the number of active light-detecting component 152) and/or to improve ambient light-sensing accuracy (e.g., by increasing that number and/or by limiting the light-detecting components 152 that may be active to those that are positioned at least a certain distance away from any active light-generating component 142 that may be emitting light EL that might otherwise be detected by a proximate light-detecting component 152 as ambient light AL). Thus, for example, only light-detecting components 152-1.0 through 152-M.0 of column CO may be activated and light-detecting components 152-1.N+1 through 152-M.N+1 of column CN+1 may be inactive for sensing ambient light when it is determined that only display pixels (e.g., one or more light-generating components 142) on the right hand side (e.g., closer to column CN+1 rather than closer to column CO) are emitting light (e.g., any light or light bright enough to be detected as ambient light). Therefore, the current and/or past and/or future condition of one or more light-generating components 142 of a display assembly (e.g., the amount and/or color and/or brightness and/or the like of one or more light-generating components 142) may be used to determine whether or not to activate one or more light-detecting components 152 of the display assembly and/or to rely on the light determined to have been detected by one or more light-detecting components 152. Additionally or alternatively, any suitable physical features may be provided to attempt to prevent any light that may be emitted by one or more light-generating components 142 of a display assembly and/or by any other light generated internally to device 100 from being detected by one or more light-detecting components 152 of the display assembly, such that light determined to have been detected by such light-detecting component(s) 152 may be relied on by device 100 (e.g., one or more applications 103 of processor 102) as ambient light (e.g., light received from an environment external to device 100). For example, as shown in FIG. 1D, a mask element 130m may be positioned between light-detecting component 152-7.0 and light-generating component 142-7.1 of display assembly 130' (e.g., to block at least a portion or all of any light emitted from light-generating component 142-7.1 of display assembly 130' from being detected by light-detecting component 152-7.0 of display assembly [130'] 130'). Device 100 may be configured to dynamically determine a desired accuracy of light sensing depending on a task that is currently performed and may activate/deactivate light-sensing components and/or light-generating components of a display assembly accordingly in order to provide the desired accuracy while conserving power. In some embodiments, each light-detecting component 152 may be kept operational but information indicative of light detected by different components 152 may be ignored or weighted differently according to how much internal light may be assumed to have been exposed to those different components 152. In other embodiments, light-detecting components 152 can themselves be selectively turned on and off to control power and granularity, because circuitry for processing the signals produced by light-detecting components 152 may consume power. In some embodiments, one or more light-detecting components 152 may be selectively used to conduct degradation sensing for one or more light-generating components 142. For example, dynamic OLED compensation can be done by illuminating various OLED cells 142 and sensing their illumination levels with neighboring photodetector cells 152 (e.g., by sensing internal light IL (e.g., when it is known that there is no ambient light or a consistent known level of ambient light detected by such photodetector cells)). Such sensing may be used to dynamically detect any degradation of the OLED cells over time and compensate for such degradation by over driving the OLED cells when degraded. In such an example, illumination of such light-generating components 142 and sensing of such light-detecting component(s) 152 may be concurrent.

Figure 2:
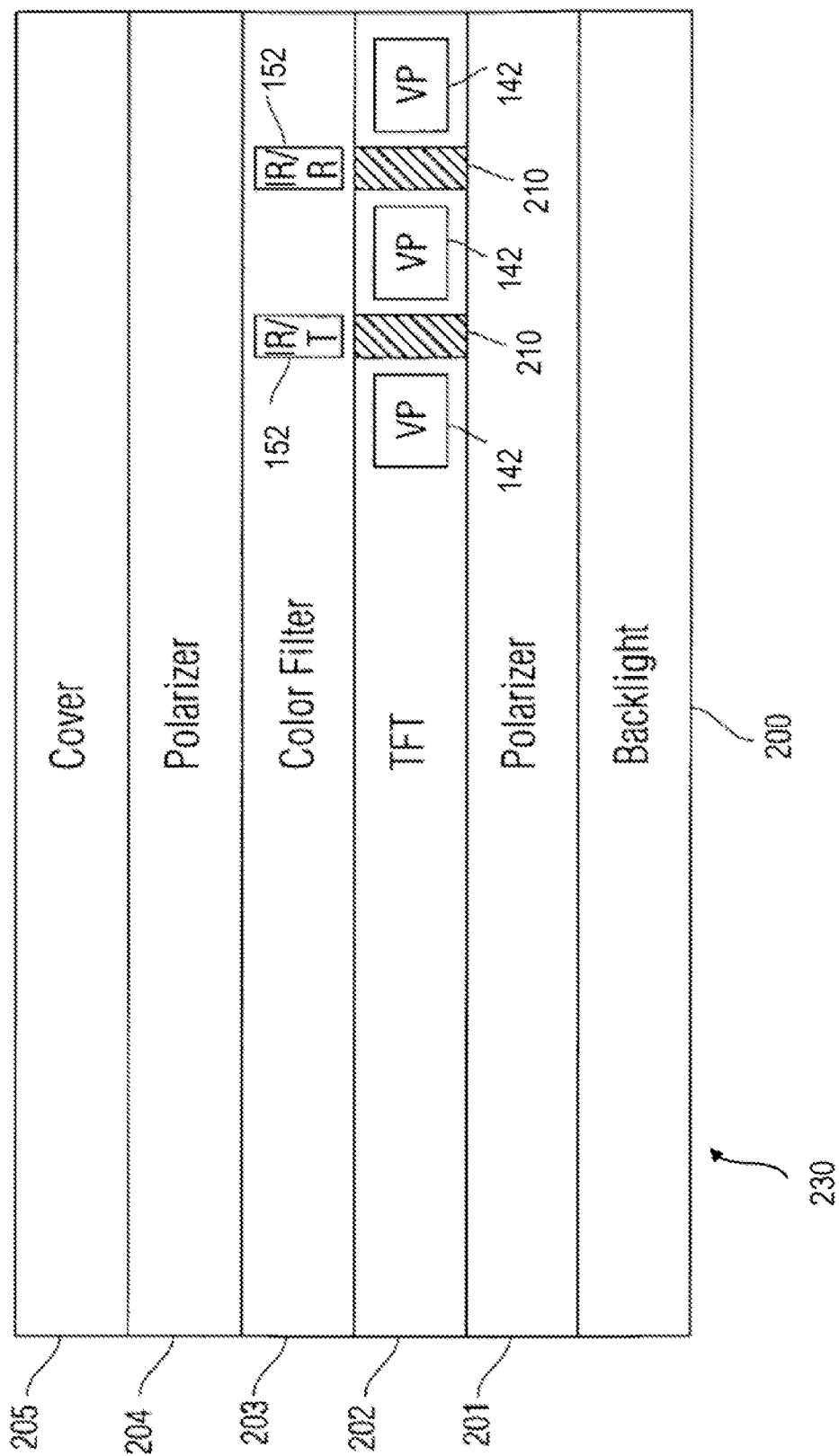
FIG. 2 is a cross-sectional view, similar to a portion of FIGS. 1C, 1D, 1E, and 1G, of a portion of another display assembly, in accordance with some embodiments.

As a very particular example, FIG. 2 may be a diagram of an exemplary display assembly 230 that may include light-emitting functionalities and light-sensing functionalities. As shown, for example, display assembly 230 may include several layers, including, but not limited to, a backlight layer 200, a polarizer layer 201, a thin film transistor (TFT) layer 203, a second polarizer layer 204, and/or a cover layer 205. As discussed above, in some embodiments, one or more light-detecting components 152 may be provided in a TFT layer of a display assembly. In other embodiments, a separate light-sensing layer may be used for one or more light-detecting components 152 of a display assembly. However, in yet other embodiments, a light-sensing functionality (e.g., one or more light-detecting components 152) can be placed in one of layers 200, 201, 203, 204, and/or 205. For example, one or more light-detecting components 152 can be placed in color filter layer 203 so as to line up with a mask 210 of TFT layer 202. Mask 210 (e.g., a black mask) can be a mask placed between the various display pixels and/or cells (e.g., components 142 and/or collections of components 142) of TFT layer 202. Thus, as shown in FIG. 2, mask barrier(s) 210 may separate display pixels including one or more light-generating components 142. One or more one or more light-detecting components 152 may be placed above one or more of masks 210 in filter layer 203 or otherwise. Thus, one or more light-detecting components 152 need not obstruct light passing from backlight layer 200 through filter layer 203. In other embodiments, one or more light-detecting components 152 can be placed in another layer above one or more black masks 210, such as polarizer layer 204 and/or cover layer 205. One or more light-detecting components 152 can be placed between display pixels in TF layer 202 or even between individual subpixels within a pixel. In some embodiments, one or more light-detecting components 152 can be placed in any of layers 200, 201, 203, 204, and 205 but not lined up with any mask 210. Instead, alternative methods can be used to ensure that one or more light-detecting components 152 do not interfere with any light-emitting functionalities of the display assembly. For example, one or more light-detecting components 152 can be made of transparent material or of a comparatively small size. In one or more embodiments, backlight layer 200 can include an optical diffuser and one or more light-detecting components 152 can be placed within such a diffuser.

While various embodiments of a display assembly with light-sensing functionalities and light-emitting functionalities may be discussed herein with respect to certain types of display technologies (e.g., LCD and OLED), they are not thus limited, but may encompass various other display technologies. While embodiments are discussed in connection with ambient light-sensing, any other suitable type of light-sensing may be enabled by a display assembly. For example, one or more light-detecting components 152 may be configured to sense UV light (e.g., a UV light component of ambient light), which may be utilized (e.g., by one or more applications 103 of processor 102 to detect UV light above a threshold and alert a user of the electronic device that the user is being exposed to UV light that may be harmful (e.g., "please consider putting sunscreen on, ambient light with a high UV index has been detected")). An OLED component 142 may be reverse biased and UV photons, which may have significantly higher energy than visible light, may be detected by such a component 142, even by a non-optimized or dedicated UV detecting diode, such as an OLED. Alternatively, a dedicated or optimized PD component 152 or otherwise may be optimized to absorb UV light (e.g., a PD can be sensitive to any wavelength from UV to IR and can be tuned to detecting a specific type of light along the spectrum (e.g., optimized to have a quantum efficiency of at least 70% for a particular type of light)).

Figure 3:
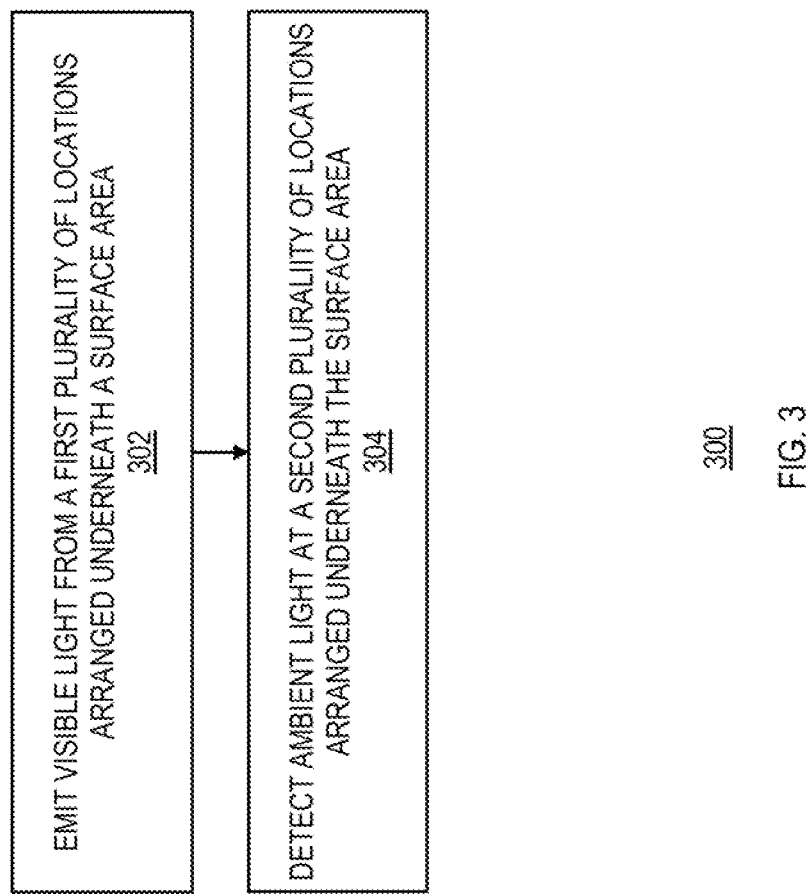
FIGS. 3-5 are flowcharts of illustrative processes for sensing light with a display assembly.

FIG. 3 is a flowchart of an illustrative process 300 for providing ambient light sensing over a surface area. At operation 302 of process 300, visible light may be emitted from a first plurality of locations arranged underneath the surface area (e.g., one or more components 142 of display assembly 130' or of display assembly 130" or of display assembly 130''' arranged underneath component 120 may emit visible light). At operation 304 of process 300, ambient light may be detected at a second plurality of locations arranged underneath the surface area (e.g., one or more components 152 of display assembly 130' or of display assembly 130" or of display assembly 130''' arranged underneath component 120 may detect ambient light AL).

It is understood that the operations shown in process 300 of FIG. 3 are only illustrative and that existing operations may be modified or omitted, additional operations may be added, and the order of certain operations may be altered.

Figure 4:
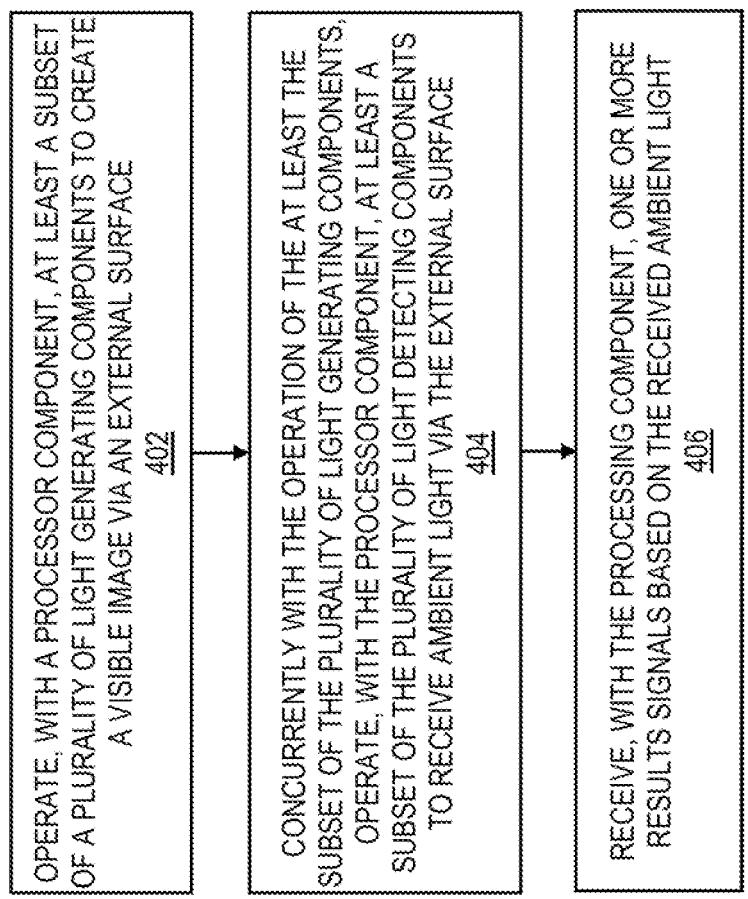

FIG. 4 is a flowchart of an illustrative process 400 for operating a display assembly of an electronic device that includes an external surface of an external component and a processor component, where the display assembly includes a plurality of light-generating components and a plurality of light-detecting components. At operation 402 of process 400, the processor component may operate at least a subset of the plurality of light-generating components to create a visible image via the external surface (e.g., processor 102 may operate one or more components 142 of display assembly 130' or of display assembly 130" or of display assembly 130''' to create a visible image via surface 121 of component 120). At operation 404 of process 400, concurrently with operation 402, the processor component may operate at least a subset of the plurality of the light-detecting components to receive ambient light via the external surface (e.g., processor 102 may operate one or more components 152 of display assembly 130' or of display assembly 130" or of display assembly 130''' to receive ambient light AL via surface 121 of component 120). At operation 406 of process 400, the processing component may receive one or more results signals based on the received ambient light (e.g., processor 102 may receive signals based on light received by one or more components 152).

It is understood that the operations shown in process 400 of FIG. 4 are only illustrative and that existing operations may be modified or omitted, additional operations may be added, and the order of certain operations may be altered.

Figure 5:
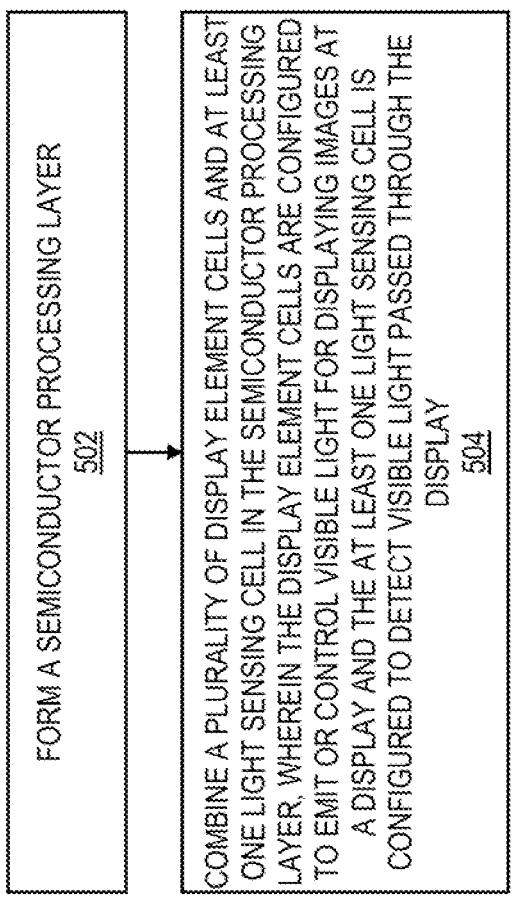

FIG. 5 is a flowchart of an illustrative process 500 for manufacturing a light-sensing display assembly. At operation 502 of process 500 emit light through the external surface. At step 502 of process 500, a semiconductor processing layer may be formed. At operation 504 of process 500, a plurality of display element cells and at least one light-sensing cell may be combined in the semiconductor processing layer, wherein the display element cells are configured to emit or control visible light for displaying images at a display and wherein the at least one light-sensing cell is configured to detect visible light passed through the display.

It is understood that the operations shown in process 500 of FIG. 5 are only illustrative and that existing steps may be modified or omitted, additional operations may be added, and the order of certain operations may be altered.

Therefore, an electronic device need not provide an ambient light sensor assembly that is distinct from a display assembly of the device. For example, an opening distinct from opening 109a through housing 101 for exposing an ambient light sensor assembly need not be provided, but, instead, an ambient light sensor assembly may be combined into a display assembly that may be exposed by a single opening through the device housing and under a single external component through which device generated light may be emitted from the display assembly to a user and through which ambient generated light may be passed and detected by the display assembly. No additional layers may need to be added to a layer stackup of a display assembly in order to add the light-sensing functionalities. Instead, one or more light-detecting components may be provided within a light-generating layer and/or within a selection or control layer for a light-generating layer.

One, some, or all of the processes described with respect to FIGS. 1-5 may each be implemented by software, but may also be implemented in hardware, firmware, or any combination of software, hardware, and firmware. Instructions for performing these processes may also be embodied as machine- or computer-readable code recorded on a machine- or computer-readable medium. In some embodiments, the computer-readable medium may be a non-transitory computer-readable medium. Examples of such a non-transitory computer-readable medium include but are not limited to a read-only memory, a random-access memory, a flash memory, a compact disc (e.g., compact disc ("CD")-ROM), a digital versatile disk ("DVD"), a magnetic tape, a removable memory card, and a data storage device (e.g., memory 104 of FIG. 1). In other embodiments, the computer-readable medium may be a transitory computer-readable medium. In such embodiments, the transitory computer-readable medium can be distributed over network-coupled computer systems so that the computer-readable code is stored and executed in a distributed fashion. For example, such a transitory computer-readable medium may be communicated from one electronic device to another electronic device using any suitable communications protocol (e.g., the computer-readable medium may be communicated from a remote entity to electronic device 100 via communications component 106 (e.g., as at least a portion of an application 103)). Such a transitory computer-readable medium may embody computer-readable code, instructions, data structures, program modules, or other data in a modulated data signal, such as a carrier wave or other transport mechanism, and may include any information delivery media. A modulated data signal may be a signal that has one or more of its characteristics set or changed in such a manner as to encode information in the signal.

It is to be understood that any, each, or at least one module or component or element or subsystem of device 100 may be provided as a software construct, firmware construct, one or more hardware components, or a combination thereof. For example, any, each, or at least one module or component or element or subsystem of device 100 may be described in the general context of computer-executable instructions, such as program modules, that may be executed by one or more computers or other devices. Generally, a program module may include one or more routines, programs, objects, components, and/or data structures that may perform one or more particular tasks or that may implement one or more particular abstract data types. It is also to be understood that the number, configuration, functionality, and interconnection of the modules and components and elements and subsystems of device 100 are only illustrative, and that the number, configuration, functionality, and interconnection of existing modules, components, elements, and/or subsystems of device 100 may be modified or omitted, additional modules, components, elements, and/or subsystems of device 100 may be added, and the interconnection of certain modules, components, elements, and/or subsystems of device 100 may be altered.

At least a portion of one or more of the modules or components or elements or subsystems of device 100 may be stored in or otherwise accessible to any portion of device 100 (e.g., in memory 104 of device 100 (e.g., as at least a portion of an application 103)). For example, any or each module may be implemented using any suitable technologies (e.g., as one or more integrated circuit devices), and different modules may or may not be identical in structure, capabilities, and operation. Any or all of the modules or other components of device 100 may be mounted on an expansion card, mounted directly on a system motherboard, or integrated into a system chipset component (e.g., into a "north bridge" chip).

Any or each module or component of device 100 may be a dedicated system implemented using one or more expansion cards adapted for various bus standards. For example, all of the modules may be mounted on different interconnected expansion cards or all of the modules may be mounted on one expansion card. Any one or more of the modules may interface with a motherboard or processor 102 of device 100 through an expansion slot (e.g., a peripheral component interconnect ("PCI") slot or a PCI express slot). Alternatively, any one or more of the modules need not be removable but may include one or more dedicated modules that may include memory (e.g., RAM) dedicated to the utilization of the module. In other embodiments, any one or more of the modules may be integrated into device 100. For example, a module may utilize a portion of device memory 104 of device 100. Any or each element or module or component of device 100 may include its own processing circuitry and/or memory. Alternatively, any or each module or component of device 100 may share processing circuitry and/or memory with any other module and/or element and/or processor 102 and/or memory 104 of device 100.

While there have been described systems, methods, and computer-readable media for sensing ambient light with a display assembly, it is to be understood that many changes may be made therein without departing from the spirit and scope of the subject matter described herein in any way. Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

Therefore, those skilled in the art will appreciate that the concepts of the disclosure can be practiced by other than the described embodiments, which are presented for purposes of illustration rather than of limitation.

What is claimed is:

1. An electronic device comprising:
a display assembly comprising:
an external display surface;
a light-emitting component operative to emit light for illuminating the external display surface;
a light-sensing component operative to detect light passing through the external display surface, wherein an element of the light-emitting component and an element of the light-sensing component lie in a single layer extending along and underneath the external display surface; and
a mask operative to block at least a portion of any light emitted by the light-emitting component from being detected by the light-sensing component.

2. The electronic device of claim 1, wherein the mask is positioned between the element of the light-emitting component and the element of the light-sensing component in the single layer.

3. The electronic device of claim 1, wherein the display assembly further comprises a selection subassembly, and wherein the selection subassembly comprises selection circuitry operative to selectively enable and disable the light-emitting component's ability to illuminate the external display surface.

4. The electronic device of claim 3, wherein the single layer is positioned between the external display surface and a layer comprising the selection circuitry.

5. The electronic device of claim 3, wherein the selection circuitry lies in the single layer.

6. The electronic device of claim 1, wherein the mask is operative to block the at least a portion of any light emitted by the light-emitting component from being detected by the light-sensing component without passing through the external display surface.

7. The electronic device of claim 1, wherein:
the element of the light-emitting component is an organic element of a light-emitting diode; and
the element of the light-sensing component is an organic element of a light-sensing diode.

8. An electronic device comprising:
a housing;
a processor within the housing; and
a display assembly comprising:
an external display surface exposed through an opening in the housing;
a light-emitting component controllable by the processor to emit light for illuminating the external display surface;
a light-sensing component controllable by the processor to detect light that has passed through the external display surface; and
selection circuitry, wherein:
the light-sensing component is provided within a backplane of the selection circuitry;
the light emitting component is positioned between the external display surface and the backplane; and
the selection circuitry is controllable by the processor to selectively enable and disable:
the light-emitting component's ability to emit the light for illuminating the external display surface; and
the light-sensing component's ability to detect the light that has passed through the external display surface.

9. The electronic device of claim 8, wherein the selection circuitry is controllable by the processor to selectively enable and disable the light-emitting component's ability to emit the light for illuminating the external display surface.

10. The electronic device of claim 8, wherein the selection circuitry is controllable by the processor to selectively enable and disable the light-sensing component's ability to detect the light that has passed through the external display surface.

11. The electronic device of claim 8, wherein the light-sensing component comprises an amorphous silicon detector.

12. The electronic device of claim 8, wherein photosensitive circuitry of the light-sensing component is provided in a transistor layer of the selection circuitry.

13. The electronic device of claim 8, wherein:
the light-emitting component is positioned in an intermediate layer between the external display surface and the backplane;
a passageway extends through at least a portion of the intermediate layer; and
the light-sensing component is positioned below the passageway.

14. The electronic device of claim 8, wherein:
the light-emitting component is positioned in an intermediate layer between the external display surface and the backplane;
the intermediate layer extends in a first direction along and underneath the external display surface until a termination end of the intermediate layer beyond which exists an intermediate layer space; and
the light-sensing component is positioned below the intermediate layer space.

15. An electronic device comprising:
a display surface;
an electrical layer;
a plurality of display components in the electrical layer, wherein the display components are configured to emit light through the display surface; and
at least one detect component in the electrical layer, wherein the at least one detect component is configured to detect visible light passed through the display surface.

16. The electronic device of claim 15, wherein the electrical layer is a semiconductor processing layer.

17. The electronic device of claim 15, wherein the display components comprise display element cells configured to emit visible light for displaying images at the display surface.

18. The electronic device of claim 15, wherein the at least one detect component comprises a light-sensing cell configured to detect visible light passed through the display surface.

19. The electronic device of claim 15, wherein a display pixel of the electronic device comprises:
the plurality of display components; and
the at least one detect component.

* * * * *